United States Patent [19]
Rudolph et al.

[11] Patent Number: 5,480,678
[45] Date of Patent: Jan. 2, 1996

[54] APPARATUS FOR USE WITH CVI/CVD PROCESSES

[75] Inventors: James W. Rudolph, Colorado Springs, Colo.; Mark J. Purdy, Akron; Lowell D. Bok, Anna, both of Ohio

[73] Assignee: The B. F. Goodrich Company, Akron, Ohio

[21] Appl. No.: 340,677

[22] Filed: Nov. 16, 1994

[51] Int. Cl.$^6$ .................................................. C23C 16/00
[52] U.S. Cl. ...................... 427/248.1; 118/715; 118/724; 118/725; 118/728
[58] Field of Search ...................................... 118/715, 724, 118/725, 728; 427/248.1

[56] References Cited

U.S. PATENT DOCUMENTS

| | | | |
|---|---|---|---|
| 3,895,084 | 7/1975 | Bauer | 264/29 |
| 3,991,248 | 11/1976 | Bauer | 425/245 |
| 4,134,360 | 1/1979 | Fisher | 118/49.1 |
| 4,212,906 | 7/1980 | Fisher | 427/237 |
| 4,580,524 | 4/1986 | Lackey, Jr. | 118/725 |
| 4,895,108 | 1/1990 | Caputo et al. | 118/728 |
| 5,348,774 | 9/1994 | Caputo et al. | 118/728 |
| 5,352,484 | 10/1994 | Bernard et al. | 427/228 |

FOREIGN PATENT DOCUMENTS

| | | |
|---|---|---|
| 0592239A2 | 4/1994 | European Pat. Off. . |
| 63-295476 | 12/1988 | Japan . |
| 4-108680 | 4/1992 | Japan . |

OTHER PUBLICATIONS

A. J. Caputo. W. J. Lackey, and D. P. Stinton, "Development of a New, Faster Process for the Fabrication of Ceramic Fiber–Reinforced Ceramic Composites by Chemical Vapor Infiltration", Metals and Ceramics Div. Oak Ridge National Laboratory, pp. 694–705.

W. J. Lackey, "Review, Status, and Future of the Chemical Vapor Infiltration Process for Fabrication of Fiber–Reinforced Ceramic Composites", 1989, Ceramic Eng. Sci. Proc. 10(7–8) pp. 577–584.

A. J. Caputo & W. J. Lackey, "Fabrication of Fiber–Reinforced Ceramic Composites by Chemical Vapor Infiltration", ORNL/TM–9235, Oak Ridge National Laboratory, Oct. 1984.

M. L. Lieberman & H. O. Pierson, "Effect of Gas Phase Conditions on Resultant Matrix Pryocarbons in Carbon/ Carbon Composites", Carbon, 1974, vol. 12, pp. 233–241, Pergamon Press (G.B.).

D. P. Stinton, A. J. Caputo, R. A. Lowden, & T. M. Besmann, "Improved Fiber–Reinforced Sic Composites Fabricated by Chemical Vapor Infiltration", Oak Ridge National Laboratory, American Ceramic Society, Inc. 1986.

O. Vohler, P. L. Reiser & E. Sperk, "Deposition of Pyrolytic Carbon in the Pores of Graphite Bodies–1." Introduction to and Results of Deposition Experiments Using Methane, Carbon 1968, vol. 6, pp. 397–403, Pergamon Press (G.B.).

T. M. Bessmann, R. A. Lowden, D. P. Stinton & T. L. Starr, "A Method for Rapid Chemical Vapor Infiltration of Ceramic Composites", Journal De Physique, Colloque C5, supplement au n. 5, Tome 50, May 1989, pp. C5–229–C5–239.

T. Huynh, C. V. Burkland, & B. Bustamante, "Densification of a Thick Disk Preform With Silicon Carbide Matrix by CVI Process", Ceramic Eng. Sci. Proc. 12(9–10) pp. 2005–2014 (1991).

T. D. Gulden, J. L. Kaae, K. P. Norton (General Atomics) & L. D. Thompson (San Diego State University), "Forced–flow Thermal–Gradient Chemical Vapor Infiltration (CVI) of Ceramic Matrix Composites", (List continued on next page.)

*Primary Examiner*—Richard Bueker
*Attorney, Agent, or Firm*—Kevin L. Leffel

[57] ABSTRACT

The invention relates to apparatus for use in chemical vapor infiltration and deposition (CVI/CVD) processes. More specifically, the invention relates to a preheater for heating a reactant gas inside a CVI/CVD furnace, and a fixture for depositing a matrix within a stack of porous structures by a pressure gradient CVI/CVD process. The invention is particularly suited for the simultaneous CVI/CVD processing of large quantities (hundreds) of aircraft brake disks.

28 Claims, 15 Drawing Sheets

OTHER PUBLICATIONS

Pro–Electrochemical Society (1990), 90–12 (Proc. Int. Conf. Chem. Vap. Deposition, 11th 1990), pp. 546–552.

S. Kimura, N. Takase, S. Kasuya & E. Yasuda, "Fracture Behaviour of C Fiber/Cvd C Composite", Carbon '80 (German Ceramic Society), 1980. pp. 617–620.

Alan S. Brown, "Faster Production Processes Cut CCC Costs", article in Aerospace America, Nov. 1994, pp. 18–19.

"Grafoil Brand Flexible Graphite®", Introduction to Grafoil®, Technical Bulletin, Union Carbide Corp. Union Carbide Canada Ltd., SPI1004, copyright 1986, one page.

W. V. Kotlensky, "Deposition of Pyrolytic Carbon in Porous Solids", Super–Temp Co., Chemistry and Physics, vol. 9, 1973, pp. 173–262.

M. L. Lieberman, R. M. Curlee, F. H. Braaten, G. T. Noles, "CVD/PAN Felt Carbonic/Carbon Composites", Composite Materials, vol. 9, Oct. 1975, pp. 337–348.

W. V. Kotlensky, "A Review of CVD Carbon Infiltration of Porous Substrates", Proc. 16th Nat. Symposium of the Soc. of Aerospace, Mat. & Proc. Eng. Apr. 1971, pp. 257–265.14.

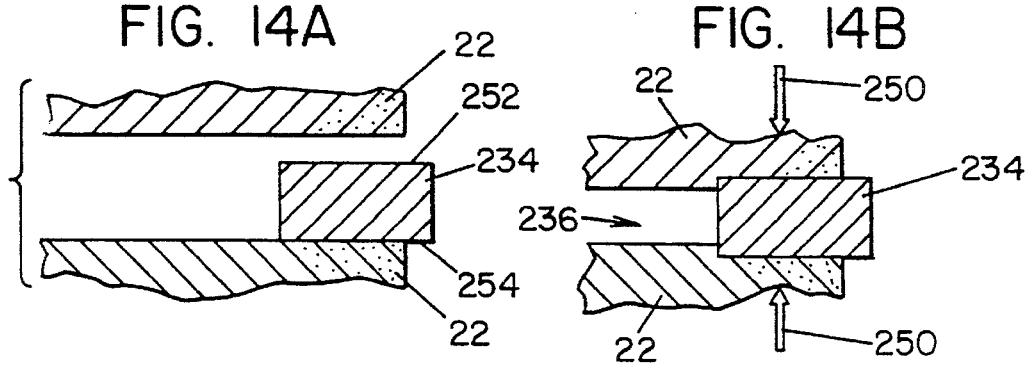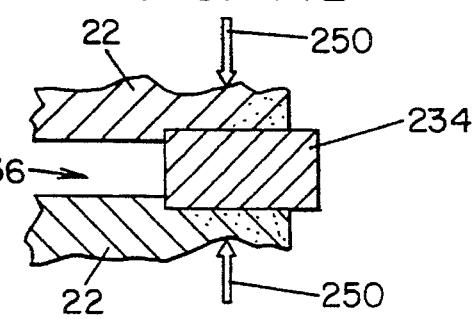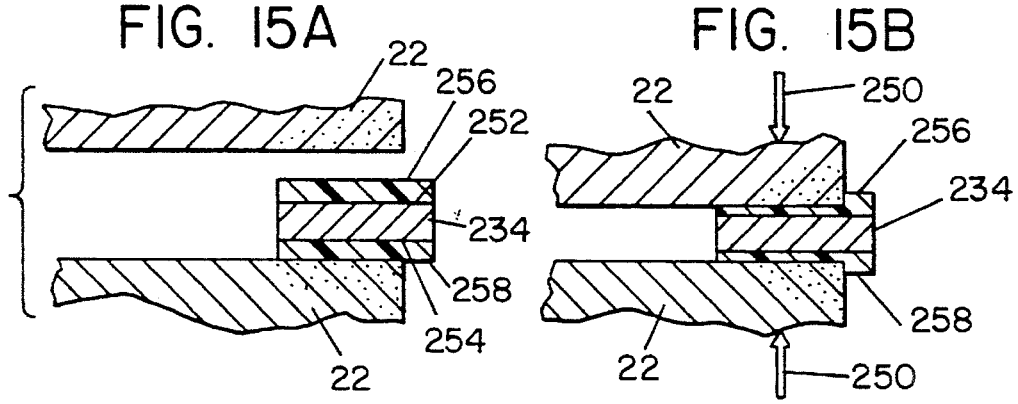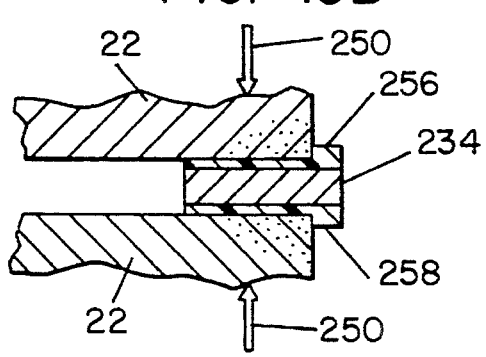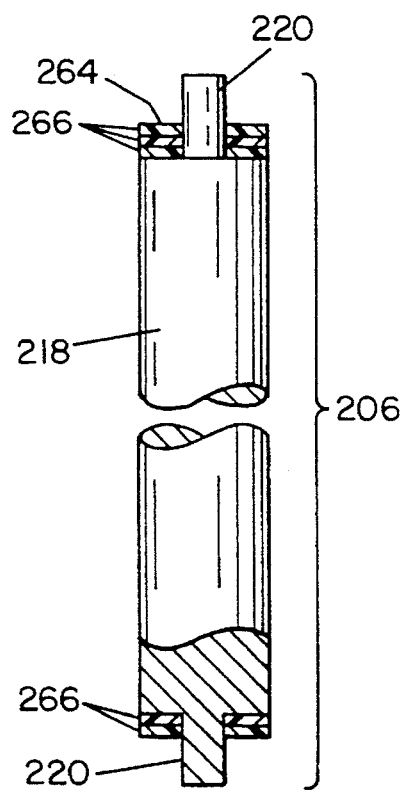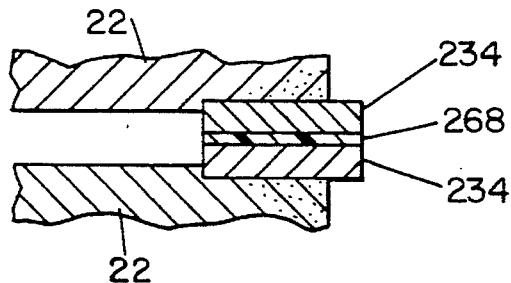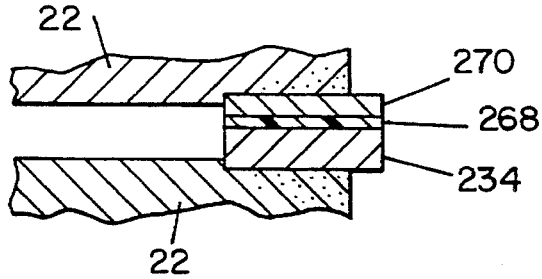

A > B

APPARATUS FOR USE WITH CVI/CVD PROCESSES

BACKGROUND OF THE INVENTION

The invention relates to apparatus for use in chemical vapor infiltration and deposition (CVI/CVD) processes. More particularly, the invention relates to a preheater for heating a reactant gas inside a CVI/CVD furnace, and a fixture for depositing a matrix within a stack of porous structures by a pressure gradient CVI/CVD process.

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids*, 8 Chemistry and Physics of Carbon, 173, 190–203 (1973); W. J. Lackey, *Review, Status, and Future of the Chemical Vapor Infiltration Process for Fabrication of Fiber-Reinforced Ceramic Composites*, Ceram. Eng. Sci. Proc. 10[7-8] 577, 577–81 (1989) (W. J. Lackey refers to the pressure gradient process as "isothermal forced flow"). In an isothermal CVI/CVD process, a reactant gas passes around a heated porous structure at absolute pressures as low as a few millitorr. The gas diffuses into the porous structure driven by concentration gradients and cracks to deposit a binding matrix. This process is also known as "conventional" CVI/CVD. The porous structure is heated to a more or less uniform temperature, hence the term "isothermal," but this is actually a misnomer. Some variations in temperature within the porous structure are inevitable due to uneven heating (essentially unavoidable in most furnaces), cooling of some portions due to reactant gas flow, and heating or cooling of other portions due to heat of reaction effects. In essence, "isothermal" means that there is no attempt to induce a thermal gradient that preferentially affects deposition of a binding matrix. This process is well suited for simultaneously densifying large quantities of porous articles and is particularly suited for making carbon/carbon brake disks. With appropriate processing conditions, a matrix with desirable physical properties can be deposited. However, conventional CVI/CVD may require weeks of continual processing in order to achieve a useful density, and the surface tends to densify first resulting in "seal-coating" that prevents further infiltration of reactant gas into inner regions of the porous structure. Thus, this technique generally requires several surface machining operations that interrupt the densification process.

In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. The fixturing for a thermal gradient process tends to be complex, expensive, and difficult to implement for densifying relatively large quantities of porous structures.

In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Prior fixturing for pressure gradient CVI/CVD tends to be complex, expensive, and difficult to implement for densifying large quantities of porous structures. An example of a process that generates a longitudinal pressure gradient along the lengths of a bundle of unidirectional fibers is provided in S. Kamura, N. Takase, S. Kasuya, and E. Yasuda, *Fracture Behavior of C Fiber/ CVD C Composite*, Carbon '80 (German Ceramic Society) (1980). An example of a process that develops a pure radial pressure gradient for densifying an annular porous wall is provided in U.S. Pat. Nos. 4,212,906 and 4,134,360. The annular porous wall disclosed by these patents may be formed from a multitude of stacked annular disks (for making brake disks) or as a unitary tubular structure. For thick-walled structural composites, a pure radial pressure gradient process generates a very large density gradient from the inside cylindrical surface to the outside cylindrical surface of the annular porous wall. Also, the surface subjected to the high pressure tends to densify very rapidly causing that surface to seal and prevent infiltration of the reactant gas to low density regions. This behavior seriously limits the utility of the pure radial pressure gradient process.

Finally, pulsed flow CVI/CVD involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. The equipment to implement such a process is complex, expensive, and difficult to maintain. This process is very difficult to implement for densifying large numbers of porous structures.

Many workers in the art have combined the thermal gradient and pressure gradient processes resulting in a "thermal gradient-forced flow" process. Combining the processes appears to overcome the shortcomings of each of the individual processes and results in very rapid densification of porous structures. However, combining the processes also results in twice the complexity since fixturing and equipment must be provided to induce both thermal and pressure gradients with some degree of control. A process for densifying small disks and tubes according to a thermal gradient-forced flow process is disclosed by U.S. Pat. No. 4,580, 524; and by A. J. Caputo and W. J. Lackey, *Fabrication Composites by Chemical Vapor Infiltration*, Prepared by the OAK RIDGE NATIONAL LABORATORY for the U.S. DEPARTMENT OF ENERGY under Contract No. DE-AD05-84OR21400 (1984). According to this process, a fibrous preform is disposed within a water cooled jacket. The top of the preform is heated and a gas is forced to flow through the preform to the heated portion where it cracks and deposits a matrix. A process for depositing a matrix within a tubular porous structure is disclosed by U.S. Pat. No. 4,895,108. According to this process, the outer cylindrical surface of the tubular porous structure is heated and the inner cylindrical surface is cooled by a water jacket. The reactant gas is introduced to the inner cylindrical surface. Similar forced flow-thermal gradient processes for forming various articles are disclosed by T. Hunh, C. V. Burkland, and B. Bustamante, *Densification of a Thick Disk Preform with Silicon Carbide Matrix by a CVI Process*, Ceram. Eng. Sci. Proc 12[9-10] pp. 2005–2014 (1991); T. M. Besmann, R. A. Lowden, D. P. Stinton, and T. L. Starr, *A Method for Rapid Chemical Vapor Infiltration of Ceramic Composites*, Journal De Physique, Colloque C5, supplement au n˙5, Tome 50 (1989); T. D. Gulden, J. L. Kaae, and K. P. Norton, *Forced-Flow Thermal-Gradient Chemical Vapor Infiltration (CVI) of Ceramic Matrix Composites*, Proc.-Electrochemical Society (1990), 90-12 (Proc. Int. Conf. Chem. Vap. Deposition, 11th, 1990) 546–52. Each of these disclosures describes processes for densifying only one porous article at a time, which is impractical for processing large numbers of composite articles such as carbon/carbon brake disks.

In spite of these advances, apparatus for implementing improved CVI/CVD processes on a large scale are generally desired. Such apparatus would preferably be capable of simultaneously densifying large numbers (as many as hundreds) of individual porous structures in a CVI/CVD process.

SUMMARY

According to an aspect of the invention, a gas preheater is provided for use in a CVI/CVD furnace that receives a reactant gas from a gas inlet, comprising:

a sealed baffle structure disposed within the furnace, the sealed baffle structure having a baffle structure inlet and a baffle structure outlet; and, a sealed duct structure disposed within the furnace, the sealed duct structure being sealed around the gas inlet and the baffle structure inlet such that substantially all of the reactant gas received from the gas inlet is directed to and forced to flow through the sealed baffle structure to the baffle structure outlet.

According to another aspect of the invention, a process is provided for introducing a reactant gas from a gas inlet into a CVI/CVD furnace, comprising the steps of:

introducing the reactant gas from the gas inlet into a gas preheater disposed within the CVI/CVD furnace, the gas preheater including a sealed baffle structure disposed within the CVI/CVD furnace having a baffle structure inlet and a baffle structure outlet, and a sealed duct structure sealed around the gas inlet and the baffle structure inlet; and, directing the reactant gas introduced from the gas inlet into the baffle structure inlet, through the sealed baffle structure, and out the baffle structure outlet.

According to yet another aspect of the invention, a fixture is provided with porous structures to be pressure gradient CVI/CVD densified inside a furnace, comprising:

a stack of porous structures, each porous structure having an aperture therethrough;

a base plate adapted to be secured inside the furnace, the base plate having a base plate aperture therethrough;

a top plate spaced from and facing the base plate;

a spacing structure disposed between the base plate and the top plate, the spacing structure engaging the base plate and the top plate, the stack of porous structures being disposed between the base plate and the top plate with one of the porous structures adjacent the base plate and another of the porous structures adjacent the top plate; and, at least one ring-like spacer disposed within the stack of porous structures between each pair of neighboring porous structures, the ring-like spacer encircling the neighboring porous structure apertures;

wherein the base plate, the stack of porous structures, and the at least one ring-like spacer define an enclosed cavity extending from the base plate aperture, including each porous structure aperture, and terminating proximate the top plate.

According to still another aspect of the invention, a process for assembling a fixture and multitude of porous structures to be CVI/CVD densified, each porous structure having an aperture therethrough, comprising the steps of:

assembling the multitude of porous structures and ring-like spacers in a stack with a ring-like spacer between each adjacent pair of porous structures;

disposing the stack of porous structures between a base plate and a top plate, the base plate having a base plate aperture therethrough, wherein the base plate, the stack of porous structures, and the at least one ring-like spacer define an enclosed cavity extending from the base plate aperture, including each porous structure aperture, and terminating proximate the top plate;

disposing a spacing structure around the stack of porous structures between the base plate and the top plate, the spacing structure engaging the base plate and the top plate.

BRIEF DESCRIPTION OF THE DRAWINGS

FIG. 14A presents a sealing arrangement according to an aspect of the invention.

FIG. 14B presents a sealing arrangement according to an aspect of the invention.

FIG. 15A presents a sealing arrangement according to an aspect of the invention.

FIG. 15B presents a sealing arrangement according to an aspect of the invention.

FIG. 16 presents a process and apparatus for adjusting stack height.

FIG. 17 presents an alternative process and apparatus for adjusting stack height.

FIG. 18 presents a process and apparatus for adjusting spacing structure height.

DETAILED DESCRIPTION

The invention and various embodiments thereof are presented in FIGS. 1 through 24 and the accompanying descriptions wherein like numbered items are identical. As used herein, the term "conventional CVI/CVD" is intended to refer to the previously described isothermal CVI/CVD process. The term "pressure gradient CVI/CVD" is intended to refer to the previously described pressure gradient CVI/CVD or forced-flow process and is intended to specifically exclude the previously described thermal gradient and thermal gradient-forced flow processes to the extent that these processes utilize an intentionally induced thermal gradient that affects the deposition process.

Figure 1:
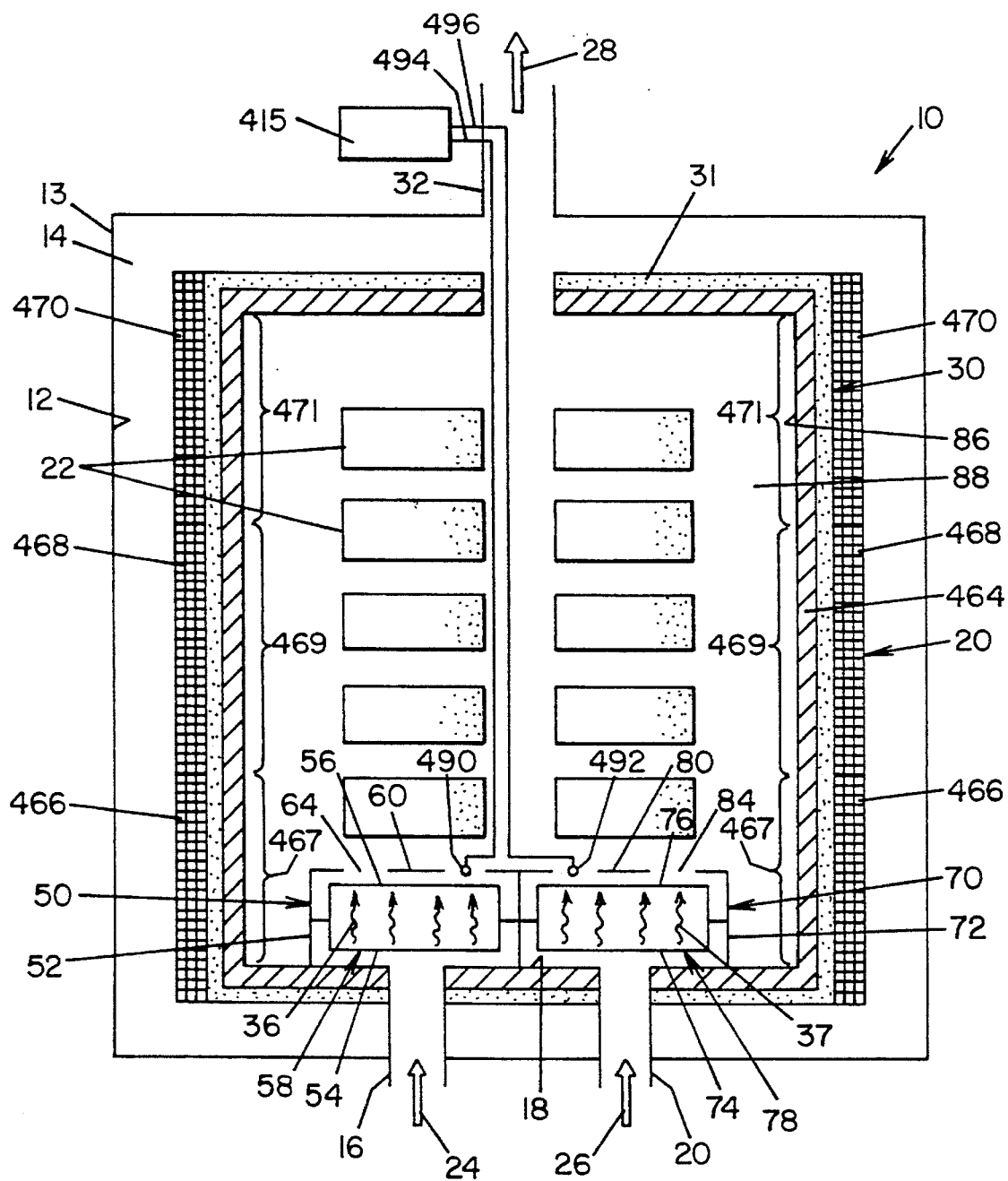
FIG. 1 presents a schematic sectional view of a CVI/CVD furnace including apparatus according to an aspect of the invention.

Referring now to FIG. 1, a schematic depiction of a CVI/CVD furnace 10 is presented having a gas preheater 50 according to an aspect of the invention. The furnace 10 has a furnace shell 13 that defines an inner surface 12. The inner surface 12 defines a furnace volume 14. The furnace 10 receives a reactant from a gas inlet 16 as indicated by arrow 24. The preheater 50 is disposed within the furnace 10 along with a quantity of porous structures 22. Porous structures 22 are supported by fixtures (not shown) that space the porous structures throughout the furnace volume. Suitable fixtures for densifying porous structures by a conventional CVI/CVD process are very well known in the art, any of which are suitable for use with the preheater 50. According to another aspect of the invention, the fixtures may be specifically adapted for densifying the porous structures 22 by a pressure gradient CVI/CVD process as will be described with more detail in relation to FIGS. 9 through 24. Furnace 10 may be heated by induction heating, resistance heating, microwave heating, or any equivalent method known in the art. According to a preferred embodiment, furnace 10 is induction heated and comprises a susceptor 30 is disposed within the furnace 10. The susceptor 30 preferably includes a generally cylindrical susceptor wall 464 and a susceptor floor 18. A first induction coil 466, a second induction coil 468, and a third induction coil 470 encircle the susceptor wall 464. An insulation barrier 31 is disposed in between the susceptor wall 464 and the coils 466, 468, and 470. The susceptor 30 has an inner surface 86 that defines a reactor volume 88 that is included within the furnace volume 14. The porous structures are disposed within the reactor volume 88 and are predominantly heated by radiation from the susceptor 30.

The preheater 50 receives the gas and raises the gas temperature before introducing the gas into the remaining reactor volume 88. Preheater 50 comprises a sealed baffle structure 58 and a sealed duct structure 52 within the furnace 10. Baffle structure 58 comprises a baffle structure inlet 54 and a baffle structure outlet 56. The sealed duct structure 52 is sealed around the gas inlet 16 and the baffle structure inlet 54 such that substantially all of the reactant gas received from the gas inlet is directed to and forced to flow through the sealed baffle structure 58 to the baffle structure outlet 56 as indicated by arrows 36. In practice, the preheater 50 may be heated to temperatures in excess of 1700° F. Maintaining perfect seals at such high temperatures is difficult. A small amount of leakage is permissible and may be difficult to avoid. The term "substantially all of the gas" is intended to allow for a small amount of leakage. At least 90%, and more preferably, at least 95% of the gas is forced to flow through the baffle structure 58. Baffle structure 58 may comprise an array of rods, tubes, perforated plates, or equivalent structure for dispersing the flow and increasing convective heat transfer from the baffle structure 58 to the reactant gas.

After entering the reactor volume 88, the gas passes around or through the porous structures 22 and leaves the furnace volume 14 through exhaust 32 as indicated by arrow 28. The gas infiltrates the porous structures 22 and deposits a binding matrix within each porous structure 22. The various aspects of the invention may be used to deposit any type of CVI/CVD matrix including, but not limited to, carbon or ceramic matrix deposited within carbon or ceramic based porous structures 22. The invention is particularly useful for depositing a carbon matrix within a carbon-based porous structure, and especially for making carbon/carbon composite structures such as aircraft brake disks. According to a preferred embodiment, a cover plate 60 is disposed over the baffle structure outlet 56 and has at least one aperture 64. The cover plate is preferably sealed around the baffle structure outlet 56 such that substantially all of the gas from the baffle structure outlet 56 is directed through the at least one aperture 64.

Figure 2:
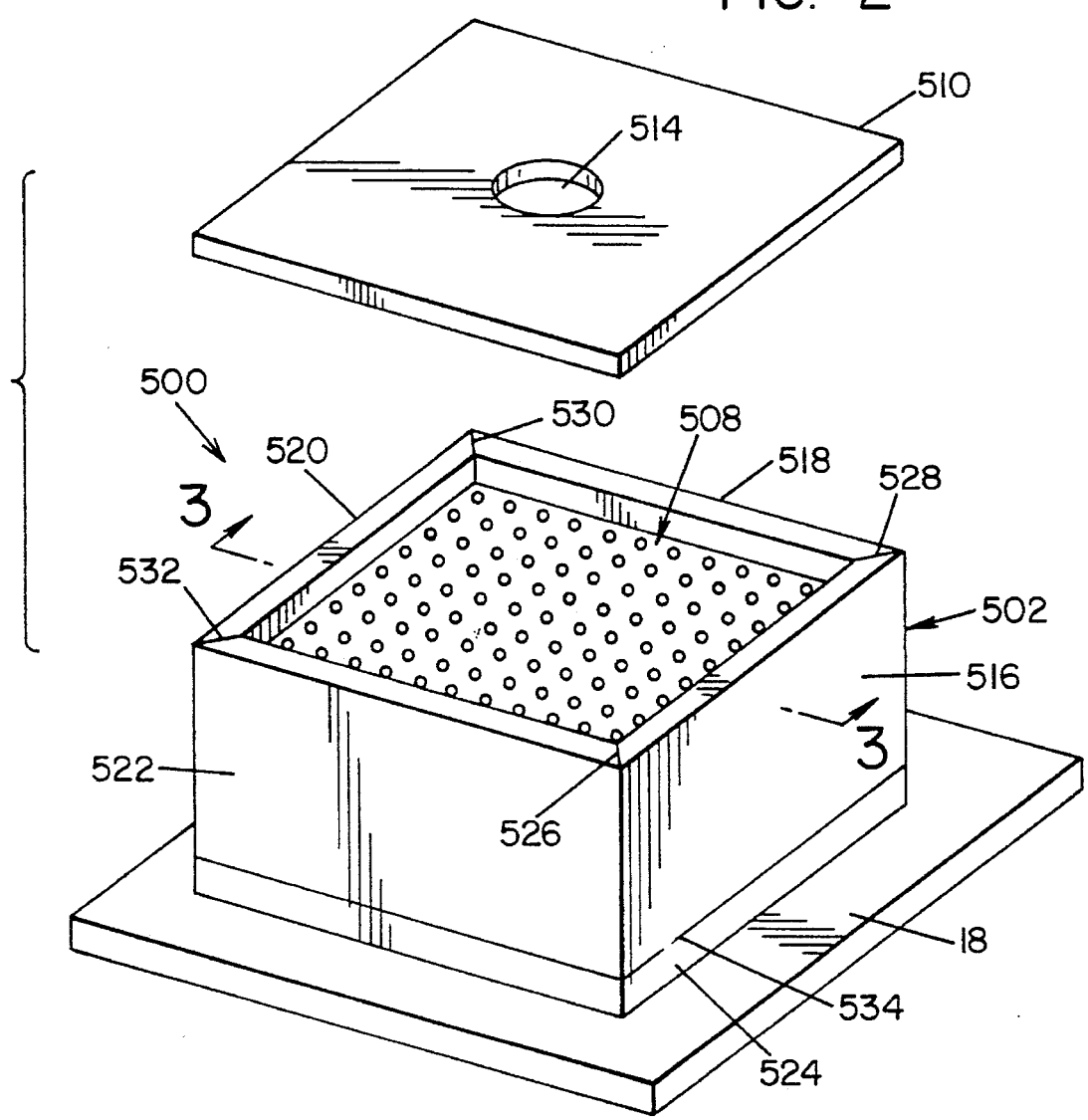
FIG. 2 presents a perspective view of a preheater according an aspect of the invention.

Referring now to FIG. 2, a preheater 500 is presented which represents a specific embodiment of preheater 50. Preheater 500 comprises a sealed duct structure 502 and a sealed baffle structure 508. The sealed duct structure 502 rests on the susceptor floor 18 and comprises a plurality of pieces 516, 518, 520, 522, and 524 that form a plurality of sealed joints 526, 528, 530, 532 and 534. The sealed joints 526, 528, 530, 532, and 534 may comprise compliant gaskets and/or hardened liquid adhesive or gasket material. A sectional view of preheater 500 taken along line 3—3 of FIG. 2 is presented in FIG. 3. The sealed baffle structure 508 preferably rests upon the sealed duct structure 502. The sealed duct structure pieces 516, 518, 520 and 522 may be provided with ledges such as ledges 536 and 538 that engage the baffle structure 508. The gas inlet 16 may be sealed to the bottom duct structure piece 524. According to a preferred embodiment, the sealed baffle structure 508 comprises a plurality of spaced parallel perforated plates 540. The bottom perforated plate 540 comprises a baffle structure inlet 504, and the top perforated plate 540 comprises a baffle structure outlet 506. Each perforated plate 540 comprises an array of perforations 542 with the array of perforations 542 of one perforated plate 540 being misaligned relative to the array of perforations 542 of an adjacent perforated plate 540. Baffle structure 508 preferably comprises an array of stacked coterminous perforated plates 540 that define a perforated plate perimeter 544 (shown as a heavy dark line). A plurality of first compliant gaskets 546 are disposed around the perforated plate perimeter 544 between each pair of adjacent perforated plates 540 which serves two purposes by sealing and spacing the perforated plates 540. A second compliant gasket 548 is disposed between the ledges 536 and 538 and the sealed baffle structure 508. Gas is introduced into the preheater through the gas inlet 16 as indicated by arrow 24. The sealed duct structure 502 allows the gas to expand and disperse as indicated by arrow 550 and directs the gas to the baffle structure inlet 504. Substantially all of gas is forced to disperse through the baffle structure 508 and exit the baffle structure outlet 506 as indicated by arrows 552. Referring again to FIG. 2, a cover plate 510 may be disposed over the baffle structure outlet 508 having at least one aperture 514. The cover plate 510 is preferably sealed around the baffle structure outlet 508 such that substantially all of the gas from the baffle structure outlet 508 is directed through the at least one aperture 514. This may be accomplished by extending the sealed duct structure a short distance above the baffle structure outlet and disposing a compliant gasket between the cover plate 510 and the sealed duct structure 502.

Figure 4:
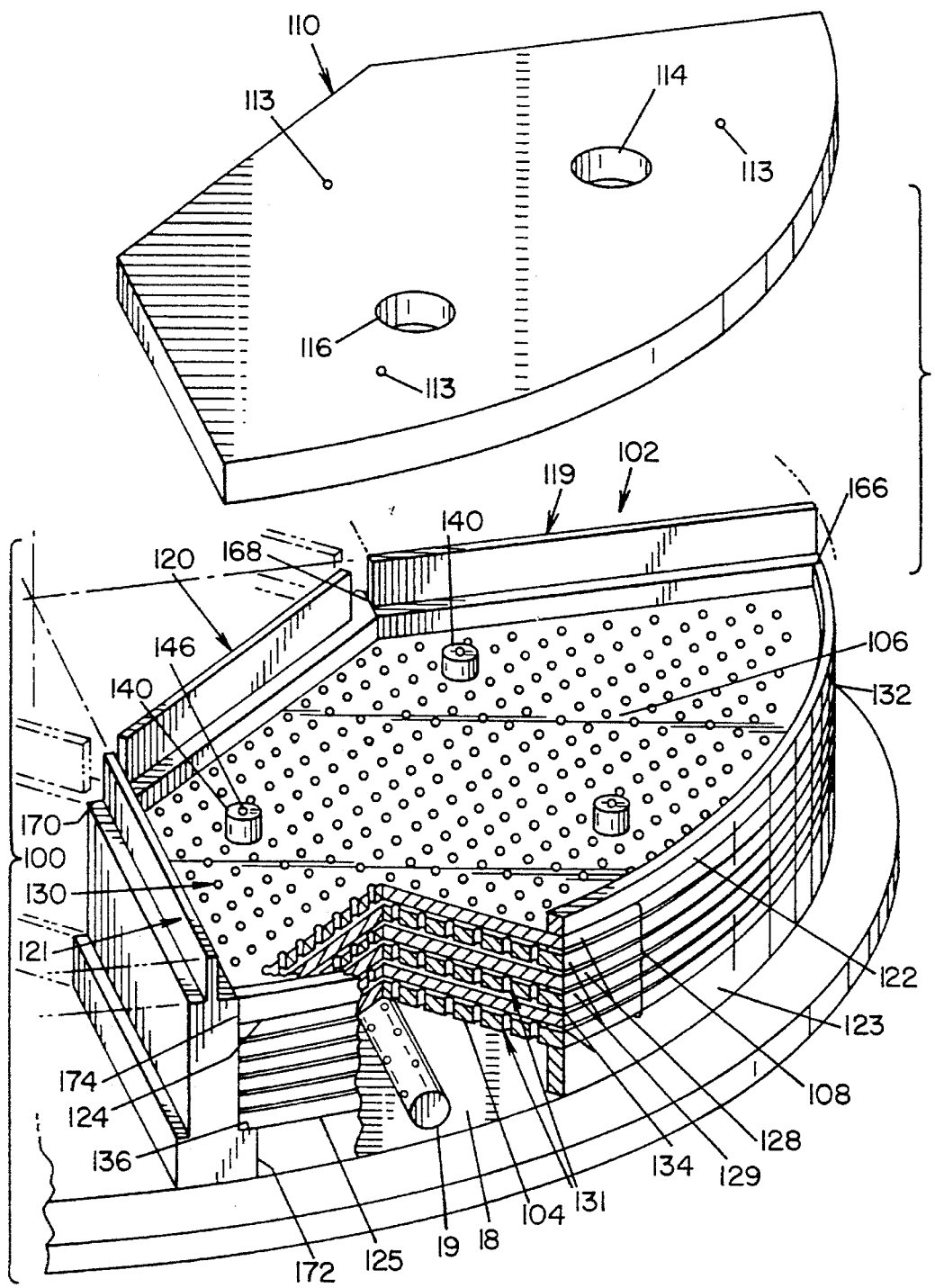
FIG. 4 presents a perspective view of another preheater according to an aspect of the invention.

Referring now to FIG. 4, a preheater 100 is presented which represents a preferred embodiment of preheater 50. The preheater 100 comprises a sealed duct structure 102 and a sealed baffle structure 108 disposed within the furnace 10. The preheater 100 receives gas from the gas inlet 16 (FIG. 1). In this example, the sealed baffle structure 108 comprises an array of spaced perforated plates 128 and 129 with a bottom perforated plate comprising a baffle structure inlet 104 and a top perforated plate comprising a baffle structure outlet 106. The sealed duct structure 102 is sealed around the gas inlet 16 (FIG. 1) and the baffle structure inlet 104 such that substantially all of the reactant gas received from the gas inlet is directed to and forced to flow through the sealed baffle structure 108 to the baffle structure outlet 106. The sealed duct structure 102 and sealed baffle structure 108 are sealed to each other so that gas cannot avoid flowing through the sealed baffle structure 108 before passing into the remaining reactor volume 88 (FIG. 1). In the embodiment presented, the sealed duct structure 102 is sealed to the susceptor floor 18 to prevent gas leaking from the preheater 100 to the reactor volume 88 without passing through the sealed baffle structure 108. Substantially all of the gas introduced into the duct structure 102 from inlet 16 is forced to flow into the sealed baffle structure 108.

Figure 6:
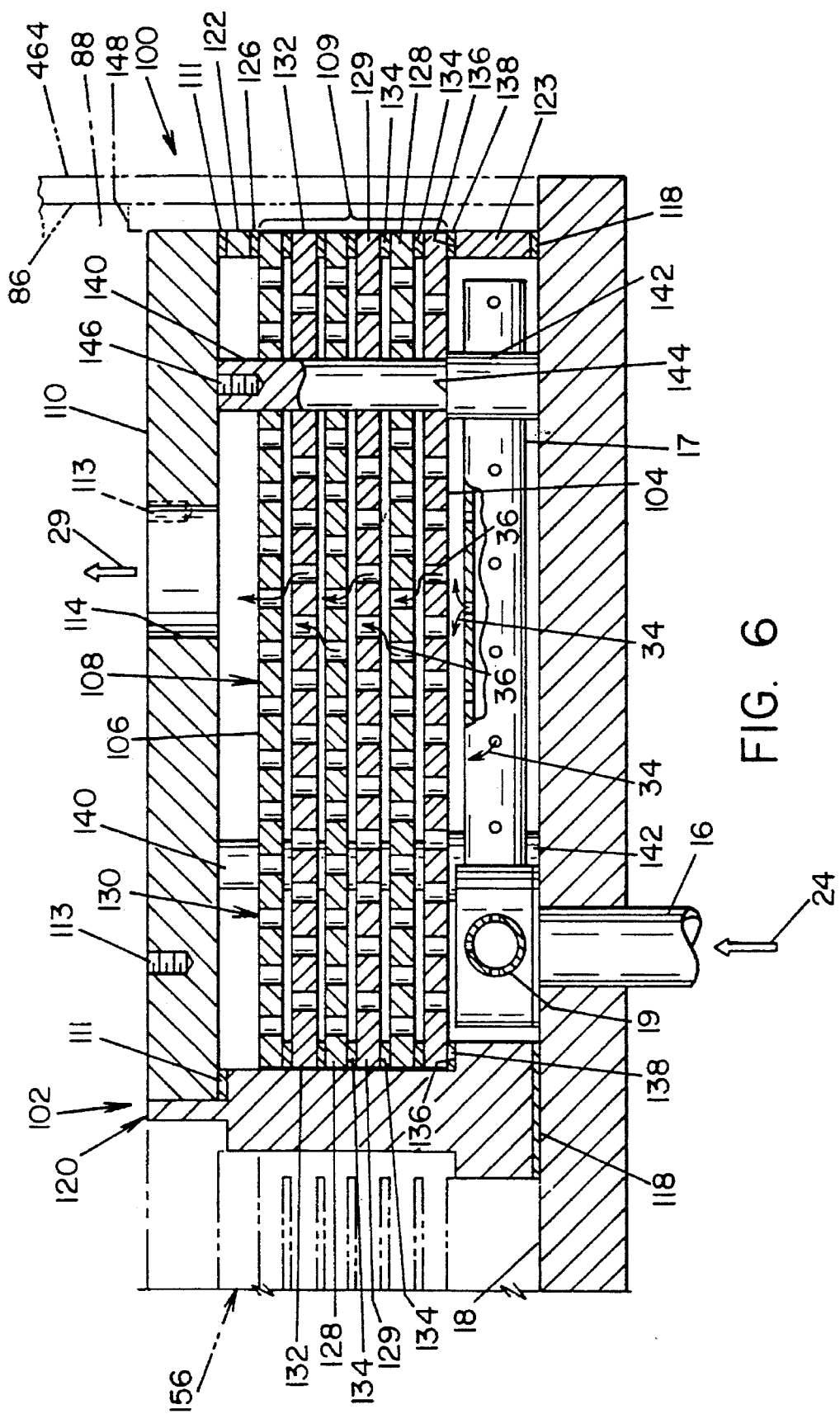
FIG. 6 presents a sectional view along line 6—6 of FIG. 5.
Figure 7:
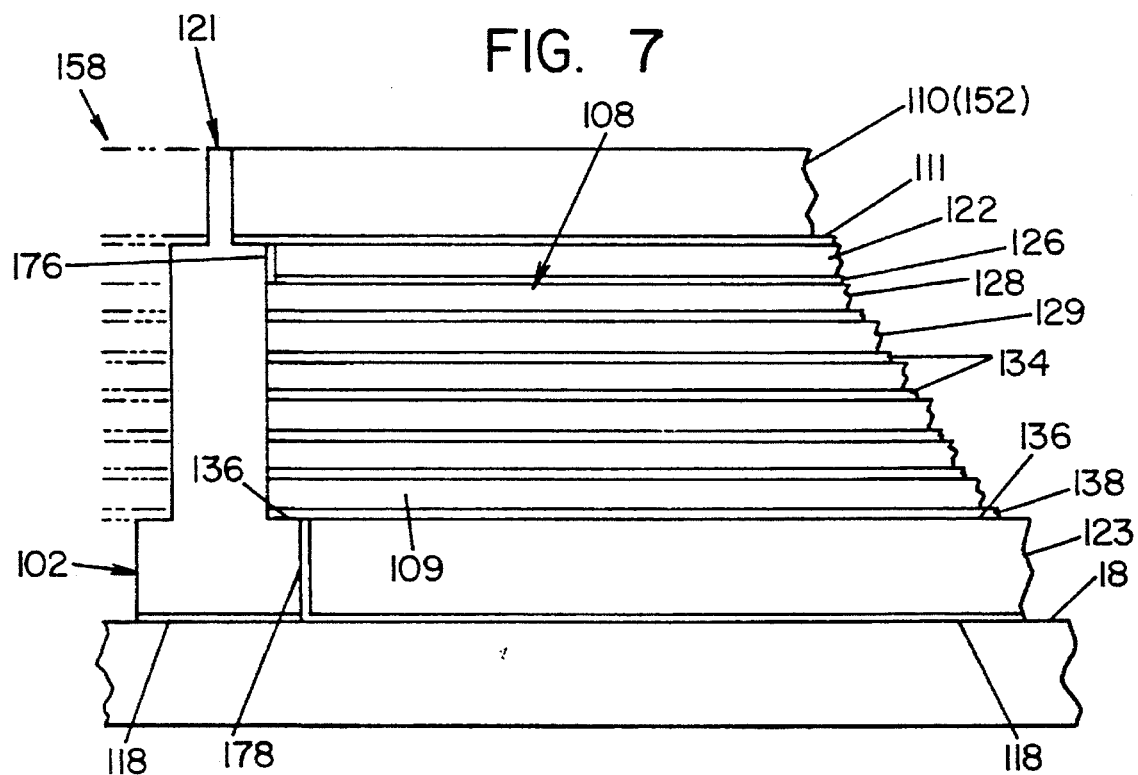
FIG. 7 presents a portion of a side view of the FIG. 4 preheater.

According to a preferred embodiment, the sealed duct structure 102 comprises at least two pieces that form a plurality of sealed joints. The pieces of preheater 100 of FIG. 4 comprise support bars 119, 120 and 121, upper ring 122 and lower ring 123 which together form several sealed joints 124, 125, 166, 168, 170, 172, and 174. The support bars 119, 120, and 121, and lower ring 123 preferably support the weight of the sealed baffle structure 108. The joints 166, 168, 170, 172, and 174 are preferably sealed with a liquid adhesive which is subsequently hardened. The joints 124 and 125 between the upper ring 122 and lower ring 123 and the sealed baffle structure 108 are preferably sealed with a compliant gaskets 126 and 138 as depicted in FIG. 6. The joints 166 and 174 between the upper ring 122 and the support bars 119 and 121 are preferably sealed with a compliant gasket 176 as depicted in FIG. 7. The joint 172 between the lower ring 123 and the support bar 121 are preferably sealed with a compliant gasket 178 as depicted in FIG. 7 (a similar gasket is provided between the lower ring 123 and the support bar 119). As depicted in FIG. 6, the seal between the sealed duct structure 102 and the susceptor floor 18 may comprise a compliant gasket 118 disposed between the perimeter structure 102 and the susceptor floor 18. Specifically, the gasket 118 may be disposed between the lower ring 123 and the susceptor floor 18, and between the support bars 119, 120, and 121 and the susceptor floor 18. A liquid adhesive may be used to enhance the seal. The compliant gasket material is particularly useful since it absorbs strain induced by thermal expansion of the various pieces comprising the sealed duct structure 102.

Figure 5:
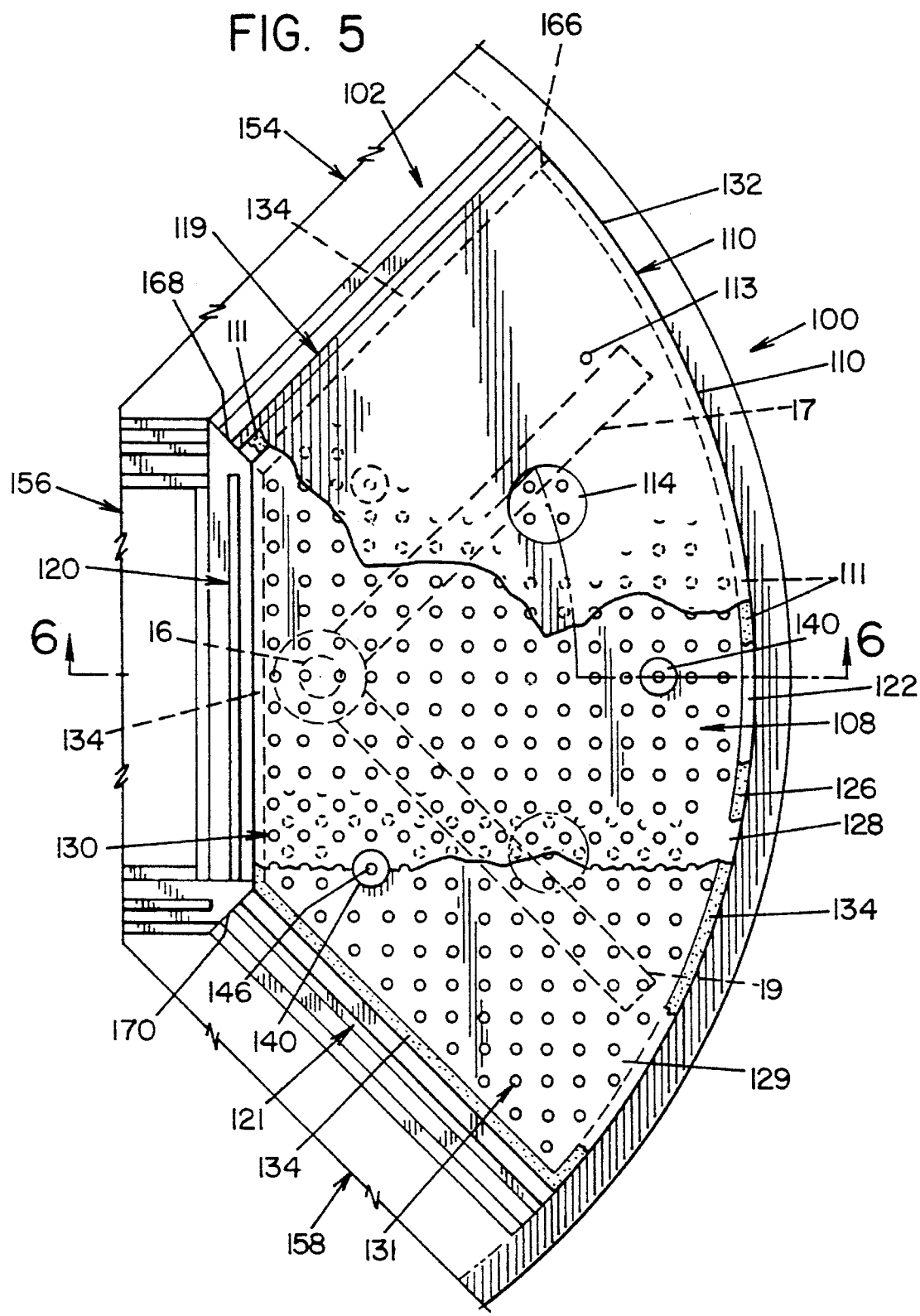
FIG. 5 presents a top view of the FIG. 4 preheater.

Referring again to FIG. 4, a cover plate 110 preferably adjoins the sealed duct structure 102 disposed over the baffle structure outlet 106. The cover plate 110 serves to support the porous structure fixtures. Cover plate 110 is adapted for use with a pressure gradient CVI/CVD process and comprises a plurality of apertures 114 and 116. An alternative cover plate 152 is presented in FIG. 24 having an array of perforations 153 and is adapted for use with a conventional CVI/CVD process where substantially even dispersion of the gas throughout the reactor volume 88 is desired. The preheater according to the invention has equal utility with either a conventional or pressure gradient CVI/CVD process. The fixtures that hold the porous structures 22 preferably rest on the cover plates 110 or 152. Referring again to FIG. 4, cover plate 110 is preferably sealed around the baffle structure outlet 106. Thus, substantially all of the gas from the baffle structure outlet 106 is directed to the apertures 114 and 116. The cover plate 110 may be sealed to the sealed duct structure 102 by placing a compliant gasket 111 in the joint between the sealed duct structure 102 and the cover plate 110 as shown in FIGS. 5 and 6. In this case, the sealed duct structure 102 extends above the sealed baffle structure 108.

Figure 8:
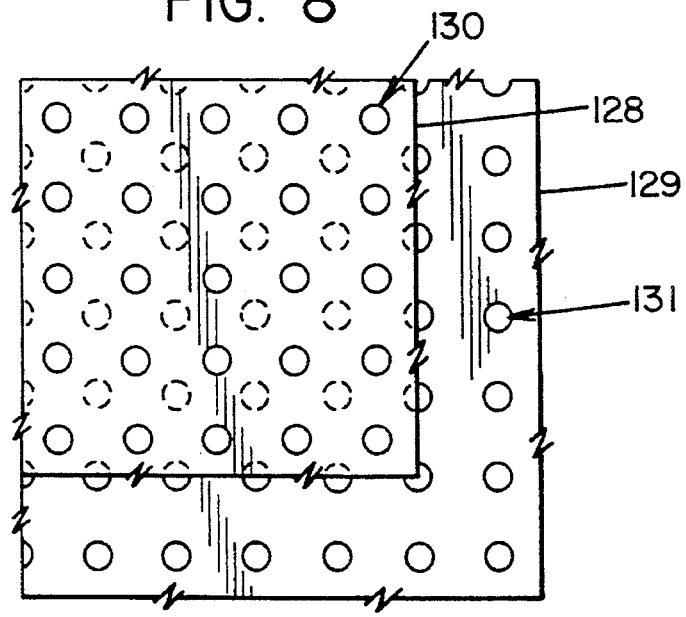
FIG. 8 presents a detailed view of an adjacent pair of perforated plates.

Referring again to FIG. 4, the sealed baffle structure 108 comprises at least one perforated plate 128. According to a preferred embodiment, a plurality of plates 128 and 129 are provided parallel and spaced from each other. According to a more preferred embodiment, plates 128 and 129 are coterminous and arranged in a stack that defines a baffle structure perimeter 132 (indicated as a bold line in FIGS. 5 and 6). Each sealed baffle structure plate 128 comprises an array of perforations 130, with the array of perforations 130 of one perforated plate 128 being misaligned with the array of perforations 131 of an adjacent perforated plate 129, as depicted in FIG. 8. Each perforation of plate 128 is preferably surrounded by and equidistant from four perforations of the adjacent plate 129. Likewise, each perforation of plate 129 is preferably surrounded by and equidistant from four perforations of the adjacent plate 128. Referring again to FIG. 4, the baffle structure perimeter 132 is sealed and comprises the outer plane-wise limit of each perforated plate 128 and 129. The baffle structure perimeter 132 is preferably sealed by disposing a compliant gasket 134 around the baffle structure perimeter 132 between each pair of adjacent perforated plates 128 and 129 as shown in FIGS. 5, 6 and 7. The compliant gasket 134 serves two purposes by sealing the baffle structure perimeter 134 and spacing the individual perforated plates 128 and 129. As depicted in FIG. 6, a portion 109 of the sealed baffle structure 108 is exposed in close proximity to the susceptor wall 464. This arrangement greatly facilitates transfer of heat by radiation from the susceptor wall 464 directly to the perforated plates 128 and 129. The heat is transferred by conduction along plates 128 and 129 and to the gas by forced convection.

As shown in FIGS. 4, 6 and 7, the sealed duct structure 108 preferably defines a ledge 136 upon which said sealed baffle structure 108 rests. In the embodiment presented, the support bars 119, 120, and 121 define the ledge in combination with lower ring 123. A compliant gasket 138 is disposed between the ledge 136 and the sealed baffle structure 108 thereby providing a seal between the sealed baffle structure 108 and the sealed duct structure 102. Referring now to FIG. 6, a plurality of posts 140 may be provided that further support the sealed baffle structure 108. Each post 140 comprises an enlarged portion 142 that defines a seat 144. The sealed baffle structure 108 rests upon the seat 144. Each post 140 has a tapped hole 146 in the portion of the post that extends above the sealed baffle structure 108. An eyebolt may be inserted into each threaded hole to which a suitable harness is attached for lifting and moving the sealed baffle structure 108. The gas preheater 100 is assembled by positioning the support bars 119, 120, and 121, and the lower ring 123 on the floor portion 18 with the appropriate seals, as previously noted. The sealed baffle structure 108 is then assembled on the posts 140 with the appropriate seals and subsequently lowered into the furnace 10 and into engagement with the ledge 136. The upper ring 122 is then installed with appropriate gaskets and adhesive on top of the baffle structure 108. The cover plate 110 or 152 is lowered into the furnace 10 and into engagement with the sealed duct structure 102. The cover plate 110 or 152 may be provided with a plurality of tapped holes 113 into which eyebolts may be inserted. A suitable harness is attached to the eyebolts for lifting and moving the sealed baffle structure 108 and cover plate 110 or 152. The posts 140 may further provide support for the cover plate 110 or 152, as shown. As shown in FIG. 6, a wedge 148 may be disposed between the susceptor wall 464 and the sealed duct structure 102 in order to prevent the upper and lower rings 122 and 123 from moving away from the support bars 119 and 121.

The various components of preheaters 50, 100, and 500 are preferably formed from monolithic graphite. Graphite cement may be used as the liquid adhesive where noted to form or enhance seals. The various compliant gaskets may be formed from a flexible graphite such as EGC Thermafoil® or Thermabraid® brand flexible graphite sheet and ribbon-pack available from EGC Enterprises Incorporated, Mentor, Ohio, U.S.A. Comparable materials are available from UCAR Carbon Company Inc., Cleveland, Ohio, U.S.A.

A process for introducing a gas from an inlet into a CVI/CVD furnace according to an aspect of the invention is presented in FIG. 6. The process begins by introducing the gas from the inlet 16 into the sealed duct structure as shown by arrows 24 and 34. The inlet 16 preferably comprises a plurality of perforated inlet legs 17 and 19 that disperse the gas within the sealed duct structure 102 before entering the sealed baffle structure 108. Next, substantially all of the gas introduced from the inlet 16 is directed into the baffle structure inlet 104, through the sealed baffle structure 108, and out the baffle structure outlet 108. The gas is forced to flow through the sealed baffle structure 108 before reaching the remaining reactor volume 88 by virtue of the sealed preheater construction as previously described. Thus, the gas is not permitted to flow directly into the reactor volume 86.

The gas must first pass through the sealed baffle structure 108. According to a preferred embodiment, the gas is forced to flow back and forth within the sealed baffle structure 108 between the several perforated plates 128 and 129 as shown by arrows 36. Forcing the gas to flow back and forth increases heat convection from the sealed perforated plates 128 and 129 to the gas and improves heating efficiency. If a pressure gradient CVI/CVD process is used, the cover plate 110 directs the flow of gas from the baffle structure outlet 106 through the aperture 114 as indicated by arrow 29. More than one aperture may be provided in cover plate 110 as shown in FIG. 4. According to a certain embodiment, a reactant gas flow of about 900 standard cubic feet per hour enters the preheater 100 at a temperature of about 800° F. and a reactor volume pressure of about 10 torr, and leaves the preheater 100 through one of the cover plate apertures 114 or 116 at a temperature of about 1750°–1800° F. with a residence time in the preheater of about 0.06 to 0.07 seconds. Residence time of the reactant gas in a preheater according to the invention is preferably in the range of about 0.05 to 0.10 seconds.

Referring again to FIG. 1, at least a second gas preheater 70 may be provided if the furnace 10 has at least a second gas inlet 20. A reactant gas is introduced into the furnace 10 through the second gas inlet 20 as indicated by arrow 26. As with preheater 50, the second preheater 70 receives the gas and raises the gas temperature before introducing the gas into the remaining reactor volume 86. Second preheater 70 comprises a second sealed baffle structure 78 and a second sealed duct structure 72 within the furnace 10. Second baffle structure 78 comprises a second baffle structure inlet 74 and a second baffle structure outlet 76. The second sealed duct structure 72 is sealed around the second gas inlet 20 and the second baffle structure inlet 74 such that substantially all of the reactant gas received from the second gas inlet is directed to and forced to flow through the second sealed baffle structure 78 to the second baffle structure outlet 76 as indicated by arrows 37. The second baffle structure 78 is heated to a greater temperature than the reactant gas at the second baffle structure inlet 74 and increases the temperature of the reactant gas before entering the remaining reactor volume 86 through the second baffle structure outlet 76. After entering the reactor volume 88, the gas passes around or through the porous structures 22 and leaves the furnace volume 14 through exhaust 32 as indicated by arrow 28. According to a preferred embodiment, a cover plate 80 is disposed over the baffle structure outlet 76 and has at least one aperture 84. The cover plate is preferably sealed around the baffle structure outlet 76 such that substantially all of the gas from the baffle structure outlet 76 is directed through the at least one aperture 84. The preheater 50 and the second preheater 70 are preferably sealed from each other in order to prevent transfer of gas between adjacent preheaters. Third and additional preheaters may be disposed in various arrangements within furnace 10 which are substantially similar to preheater 50 and second preheater 70.

As shown in FIG. 5, additional preheaters 154, 156 and 158 may be disposed adjacent preheater 100, and the individual sealed duct structures may share structure disposed between adjacent preheaters. If the furnace is cylindrical, a plurality of outer preheaters may be shaped as arcuate segments disposed around a single polygonal shaped preheater disposed in the center of the furnace floor. In the example presented, the center preheater is square. Separate gas inlets may be provided for each sealed duct structure.

Referring again to FIG. 1, a first gas temperature of the flow of reactant gas is sensed proximate the baffle structure outlet 56 by a first temperature sensor 490. The preheater temperature may be adjusted to achieve a desired gas temperature by increasing or decreasing heating of the preheater 50. In FIG. 1, the susceptor wall 464 is comprised of a first susceptor wall portion 467, a second susceptor wall portion 469, and a third susceptor wall portion 471. The first induction coil 466 is inductively coupled to the first susceptor wall portion 467 in a manner that transforms electrical energy from the first induction coil 466 to heat energy in the first susceptor wall portion 467. The same applies to the second susceptor wall portion 469 and the second induction coil 468, and the third susceptor wall portion 471 and third induction coil 470. The preheater 50 is predominantly heated by radiation heat energy from the first susceptor wall portion 467 which is adjacent the first induction coil 466. Thus, the first preheater temperature may be adjusted by adjusting electrical power to the first induction coil 466. The electrical power to the second induction coil 468 and 470 may be adjusted as necessary to maintain a desirable porous structure temperature profile along the length (in the general direction of gas flow) of the furnace. The first preheater 50 is preferably disposed proximate the first susceptor wall portion 467 which improves the transfer of heat energy by radiation. The temperature sensed by first temperature sensor 490 may be transmitted to a controller 415 via first temperature sensor line 494. The controller permits manual or automatic adjustment of electrical power to the first induction coil 466 as necessary to achieve a desired temperature of the gas flow as it leaves the baffle structure outlet 56. A second temperature sensor 492 may similarly be provided to sense the temperature of the gas leaving the second baffle structure outlet 76. The temperature sensed by the second temperature sensor 492 may be communicated to the controller 415 via second temperature sensor line 496. As previously described, multiple preheaters may be provided with one or more preheaters being surrounded by other preheaters that are proximate the susceptor wall 464 which block transfer of heat energy by radiation to the center preheater. In such a case, the center preheater is heated predominantly by conduction from the adjacent preheaters that are heated by radiation. Thus, the center preheater is indirectly heated by radiation from the susceptor wall and the center preheater temperature may be controlled by varying power to the first induction coil 466. Also, the preheaters could be resistance heated which would permit direct control of the heat energy supplied to each preheater. Such variations are considered to be within the purview of the invention.

Figure 9:
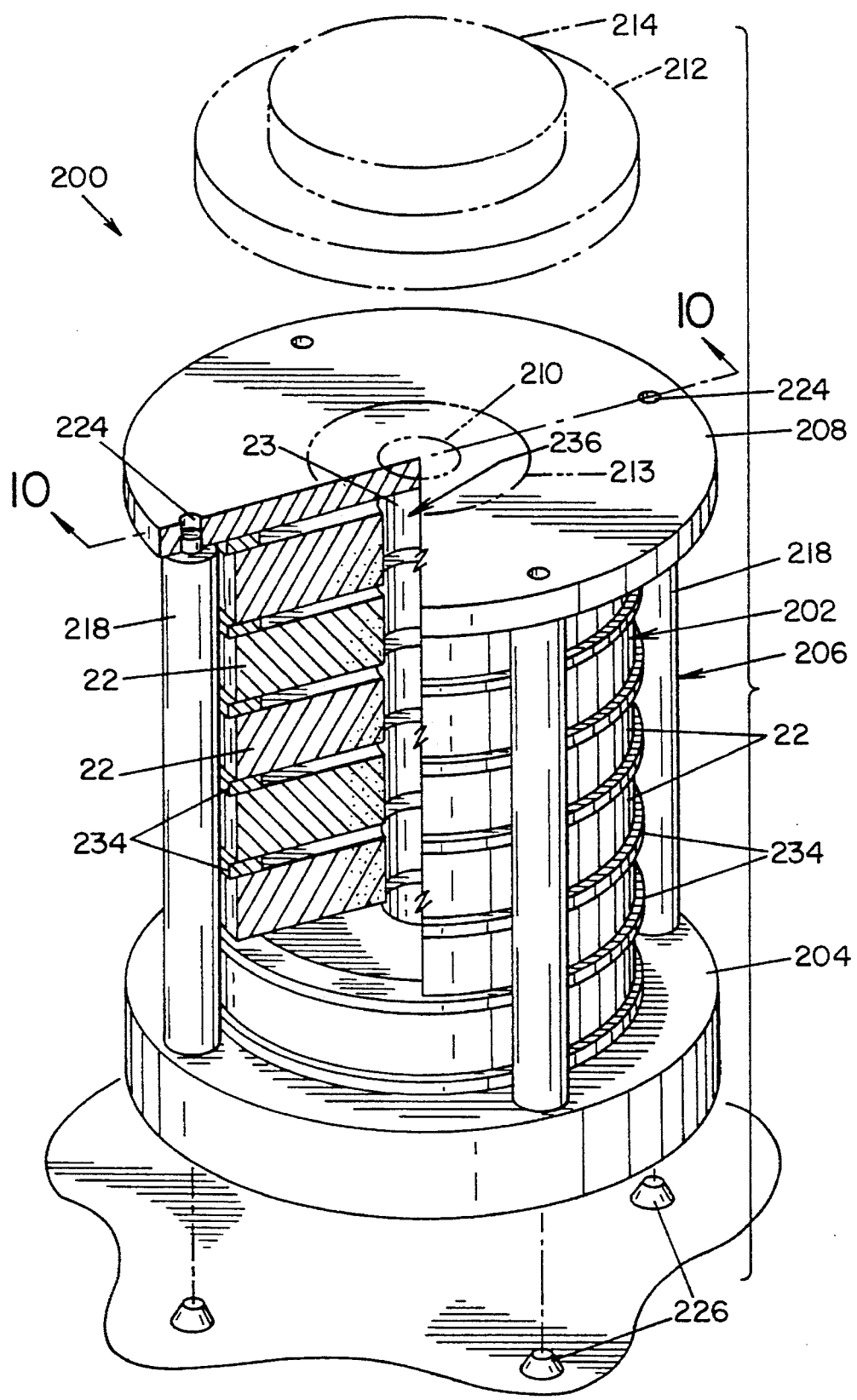
FIG. 9 presents a fixture with a stack of porous structures according to an aspect of the invention.
Figure 10:
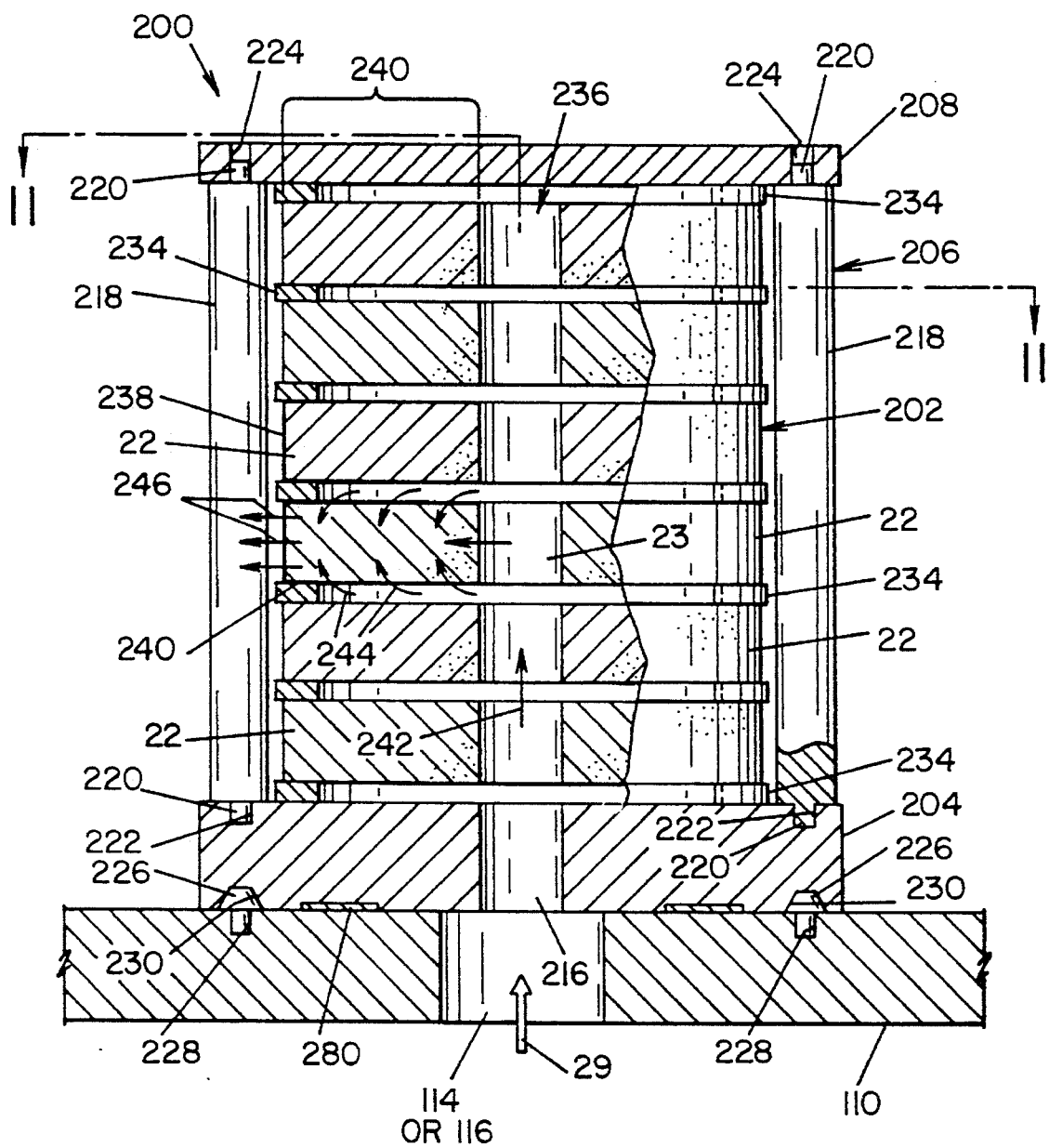
FIG. 10 presents a sectional view along line 10—10 of FIG. 9.

A fixture 200 with the porous structures 22 to be pressure gradient CVI/CVD densified inside a furnace is presented in FIG. 9. The porous structures 22 are arranged in a stack 202. The fixture comprises a base plate 204, a spacing structure 206, and a top plate 208. The top plate 208 optionally has an aperture 210 which is sealed by a cover plate 212 and weight 214. With this option, a cover plate seal 213 is preferably disposed between the cover plate 212 and the top plate 208 that encircles the top plate aperture 210. Each porous structure 22 has an aperture 23. The fixture 200 with the porous structures 22 may be disposed within the reactor volume 88 of CVI/CVD furnace 10 (FIG. 1). Referring now to FIG. 10, a sectional view of the fixture 200 along line 10—10 of FIG. 9 is presented. The base plate 204 is adapted to be secured inside the CVI/CVD furnace 10 (FIG. 1) to the cover plate 110, which is preferably sealed to a preheater such as preheater 100 as shown in FIG. 6. Still referring to FIG. 10, the base plate 204 has a base plate aperture 216 in fluid communication with cover plate aperture 114 or 116.

Figure 3:
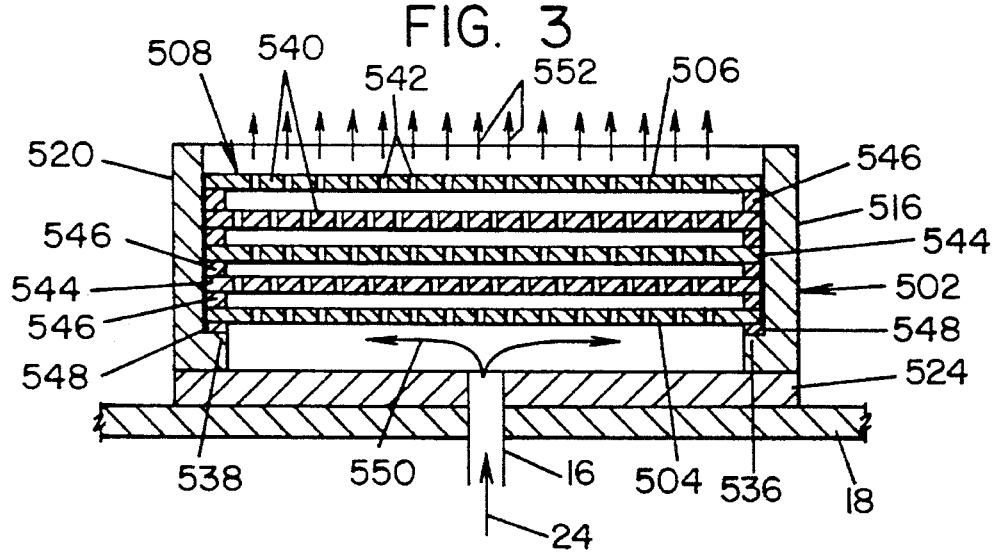
FIG. 3 presents a sectional view along line 3—3 of FIG. 2.

The base plate is preferably located by a plurality of conical pins 226 disposed in mating conical pin holes 228 in cover plate 110. The base plate 204 has mating conical base plate holes 230 that are aligned with and receive the conical pins 226. This arrangement facilitates aligning the base plate aperture 216 with the cover plate aperture 114 or 116. The base plate 204 is preferably sealed to the cover plate 114 or 116, and a compliant gasket 280 may be disposed between the base plate 204 and the cover plate 110 for this purpose. The fixture 200 may also be used in similar manner with other sealed preheaters, including preheater 500 (FIGS. 2 and 3).

The top plate 208 is spaced from and faces the base plate 204. The spacing structure 206 is disposed between and engages the base plate 204 and the top plate 208. In the embodiment presented, the spacing structure comprises a plurality of spacing posts 218 disposed about the stack of porous structures extending between the base plate 204 and the top plate 208. Each post has pins 220 at either end that are received by mating holes 222 in base plate 204 and mating holes 224 in top plate 208. The spacing structure 206 preferably comprises at least three posts 218. The spacing structure 202 could also be formed as a single piece such as a perforated cylinder or an equivalent structure, and other arrangements for engaging the base plate 204 and top plate 208 are possible, any of which are considered to be within the purview of the invention.

The stack of porous structures 202 is disposed between the base plate 204 and the top plate 208 with one of the porous structures 22 adjacent the base plate 204 and another of the porous structures 22 adjacent the top plate 208. At least one ring-like spacer 234 is disposed within the stack of porous structures 202 between each pair of neighboring porous structures 22. The ring-like spacer 234 encircles the neighboring porous structure apertures 23. At least one of the ring-like spacers 234 is preferably disposed between the base plate 204 and porous structure 22 adjacent the base plate 204, and at least one of the ring-like spacers 234 is preferably disposed between the top plate 208 and porous structure 22 adjacent the top plate 208. Ring-structures similar to the ring-like spacers 234 adjacent the top plate 208 and base plate 204 may also be integrally formed into the base plate 204 and top plate 208 which would eliminate the need for these ring-like spacers. The base plate 204, the stack of porous structures 202, and the at least one ring-like spacer 234 define an enclosed cavity 236 extending from the base plate aperture 216, including each porous structure aperture 23, and terminating proximate the top plate 208. The cover plate 212 and the cover plate seal 213 terminate the enclosed cavity 236 if top plate 208 has the top plate aperture 210 at the top of the stack 202.

Fixture 200 is particularly suited for use with a pressure gradient CVI/CVD process, but could also be used with the previously described thermal gradient-forced flow CVI/CVD process with appropriate cooling jackets. Referring still to FIG. 10, a gas is introduced into the enclosed cavity 236 through the cover plate aperture 114 or 116 as indicated by arrow 29. The flow is induced by establishing a difference in pressure between the reactor volume 88 (FIG. 1) and the enclosed cavity 236. The gas flows through the cavity 236 in the direction of arrow 242, into each porous structure as indicated by arrows 244, and out of each porous structure as indicated by arrows 246, where it flows out of the furnace volume 14 through exhaust 32 in the direction of arrow 28 (see FIG. 1). The forced gas dispersion or flow through the porous structures 22 is preferably induced by reducing the pressure in the furnace volume 14 and the reactor volume 88 to a vacuum pressure and supplying a reactant gas at a greater pressure to the enclosed cavity 236 through a sealed preheater structure, as previously described, which develops a pressure gradient across the porous structure. Each annular porous structure 22 has a surface area 238 (designated by a heavy line in FIGS. 10 and 11). Part of the surface area 238 is covered by the ring-like spacers and is not exposed to the gas as it enters or leaves the porous structure 22. Preferably, a majority (at least 50%) of the surface area 238 of each porous structure 22 is exposed to the gas as it enters or leaves the porous structure 22. As much as possible of the surface area 238 is preferably exposed. In practice, the porous structures 22 and ring-like spacers may take a variety of shapes, such as elliptical, square, polygonal, etc., any of which are considered to fall within the purview of the invention. However, the porous structures 22 are preferably annular in shape with two flat opposing surfaces for making aircraft brake disks. Thus, still referring to FIGS. 10, the stack of annular porous structures 202 with the fixture 200 define an annular porous wall 240 with the reactant gas being admitted to and withdrawn from the CVI/CVD furnace on opposite sides of the annular porous wall.

Figure 11:
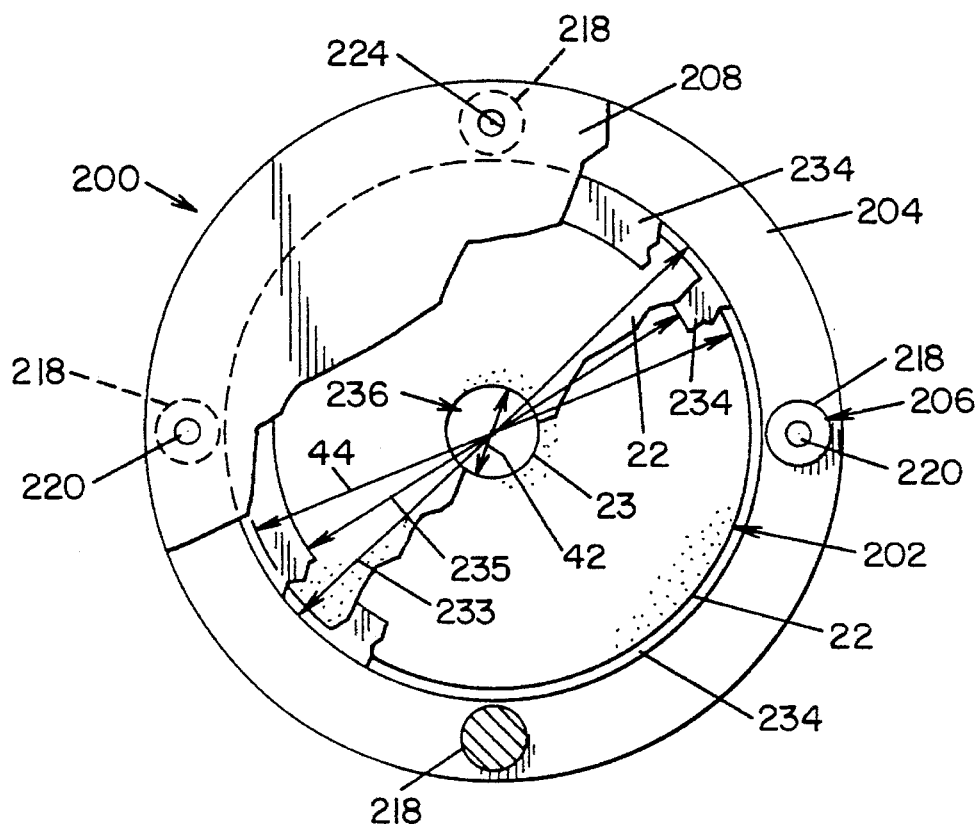
FIG. 11 presents a sectional view along line 11—11 of FIG. 10.

Referring now to FIG. 11, a sectional view along line 11—11 of FIG. 10 is presented. According to a preferred embodiment, each porous structure aperture 23 defines a porous structure inside diameter 42 and each ring-like spacer defines a spacer inside diameter 235, with each porous structure inside diameter 42 being less than the spacer inside diameter 235. More preferably, the porous structure 22 defines an outside diameter 44, and the spacer inside diameter 235 is slightly less than the porous structure outside diameter 44 in order to expose as much as possible of the porous structure surface area to the reactant gas. In such a case, the ring-like spacer 234 is generally coterminous with the porous structure outside diameter 235. The difference between the spacer inside diameter 235 and porous structure outside diameter must be great enough to facilitate assembly, but small enough to minimize the bond force between the ring-like spacer and the porous structure 22 following a densification process. The spacer outside diameter 233 is preferably large enough to provide a pry-point between the ring-like spacer 234 and the porous structure, which facilitates removing the ring-like spacer 234 following a densification process, while being compact enough to maximize usage of furnace space. According to a certain embodiment, the spacer outside diameter 233 is about 21.9 inches and the spacer inside diameter 235 is about 19.9 inches for processing annular porous structures 22 having an outside diameter of about 21 inches. The ring-like spacers are preferably at least 0.25 inch thick.

FIGS. 14A and 14B present a detailed view of the ring-like spacer 234 and how it interfaces between a pair of neighboring porous structures 22. Each ring-like spacer 234 comprises two generally parallel spacer sides 252 and 254 spaced from each other and facing the neighboring porous structures 22. If the porous structures 22 are compliant, the neighboring porous structures 22 may be pressed against the ring as indicated by arrows 250 which slightly deforms the porous structure 22 and develops a seal. Pressing the adjacent porous structures against the ring-like spacer 234 seals each porous structure against the ring-like spacer 234 which prevents the gas from leaking into the reactor volume without passing through the porous structure 22. Ring-like spacer 234 having smooth ring-like spacer sides 252 and 254 seal coated with pyrolytic carbon are separable from the porous structures 22 after densification. According to a preferred embodiment, the ring-like spacer 234 is machined from monolithic graphite with the ring-like spacer sides 252 and 254 having a maximum surface roughness of 125 RMS microinches. This was a surprising discovery since it eliminated the need for gaskets between the spacer and the porous structures and greatly simplified stack assembly.

An alternative embodiment for ring-like spacer 234 is presented in FIGS. 15A and 15B. In this embodiment, at least one ring-like compliant gasket 256 and 258 is disposed adjacent each spacer side 252 and 254, and each compliant gasket 256 and 258 is pressed against the neighboring porous structure 22 as indicated by arrows 250 which deforms the compliant gaskets 256 and 258 against the ring-like spacer 234 and forms a seal. This embodiment is preferable if the porous structures 22 are not compliant (already partially densified for example), in which case merely pressing the porous structures 22 against the ring-like spacer 234 as in FIGS. 14A and 14B does not produce a sufficient seal.

Figure 12A:
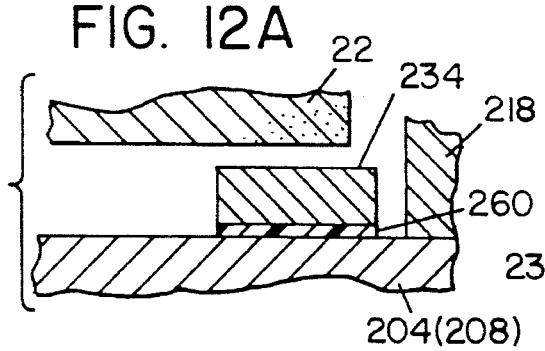
FIG. 12A presents a sealing arrangement according to an aspect of the invention.
Figure 12B:
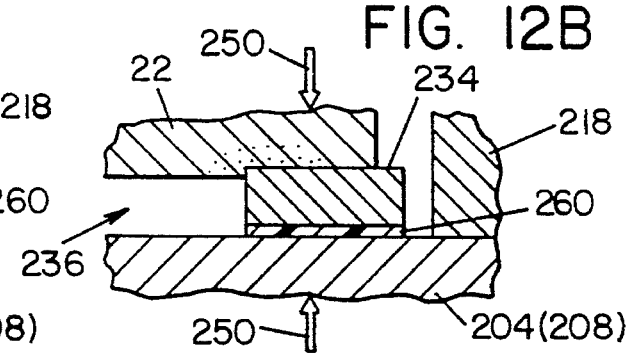
FIG. 12B presents a sealing arrangement according to an aspect of the invention.
Figure 13A:
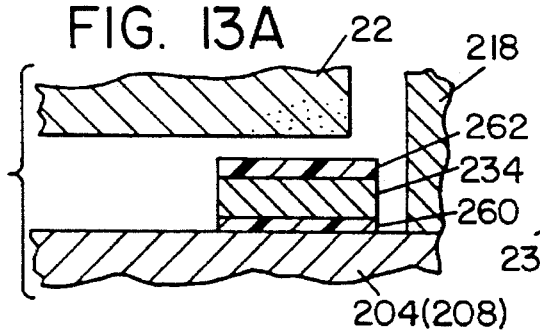
FIG. 13A presents a sealing arrangement according to an aspect of the invention.
Figure 13B:
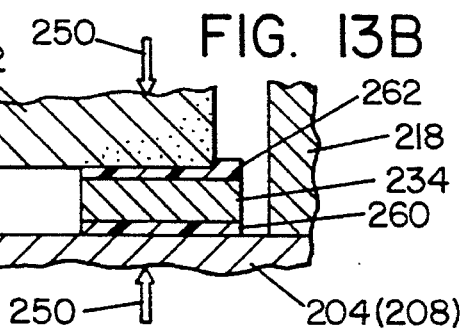
FIG. 13B presents a sealing arrangement according to an aspect of the invention.

Referring to FIGS. 12A and 12B, a detailed view of the ring-like spacer 234 adjacent either the base plate 204 or top plate 208 is presented. The top plate 208, bottom plate 204, and ring-like spacer 234 are formed from a non-compliant material. Therefore, a ring-like compliant gasket 260 is disposed between the ring-like spacer 234 and the top plate 208 or bottom plate 204. If the porous structure 22 is compliant, it may be pressed against the ring-like spacer 234 as indicated by arrows 250 which deforms the porous structure 22 and forms a seal. Compressing the porous article 22 against the ring-like spacer 234 effectively prevents the gas from leaking from the enclosed cavity 236 to the reactor volume without passing through the porous structure 22. An alternative embodiment is presented in FIG. 13A and 13B. This embodiment is preferable if the porous structure 22 is relatively rigid and not compliant. An additional ring-like compliant gasket 262 is disposed between the ring-like spacer 234 and porous structure 22 and subsequently subjected to a compressive force as indicated by arrows 250. Both gaskets 260 and 262 are preferably compliant.

The various components of the fixture 200 according to the invention are preferably machined from monolithic graphic. The various compliant gaskets may be formed from a flexible graphite such as EGC Thermafoil® brand flexible graphite sheet and ribbon-pack available from EGC Enterprises Incorporated, Mentor, Ohio, U.S.A. Comparable materials are available from UCAR Carbon Company Inc., Cleveland, Ohio, U.S.A. Other types of seals may be used in the practice of the invention such as graphite or ceramic-based cements and pastes. However, the seals disclosed herein are economically practical and facilitate assembling the fixture 200 and stack of porous structures 202 before densification, and disassembling the fixture 200 and stack of porous structures 202 after densification. The stack of porous structures 202 is formed using the described seals and disposed in compression between the base plate 204 and the top plate 208. After densification, the top plate 208 may be removed, and the stack disassembled for further processing of the porous structures 22. The ring-like spacers 234 and other components comprising the fixture 200 may be subsequently reused to densify other porous structures 22.

Figure 19A:
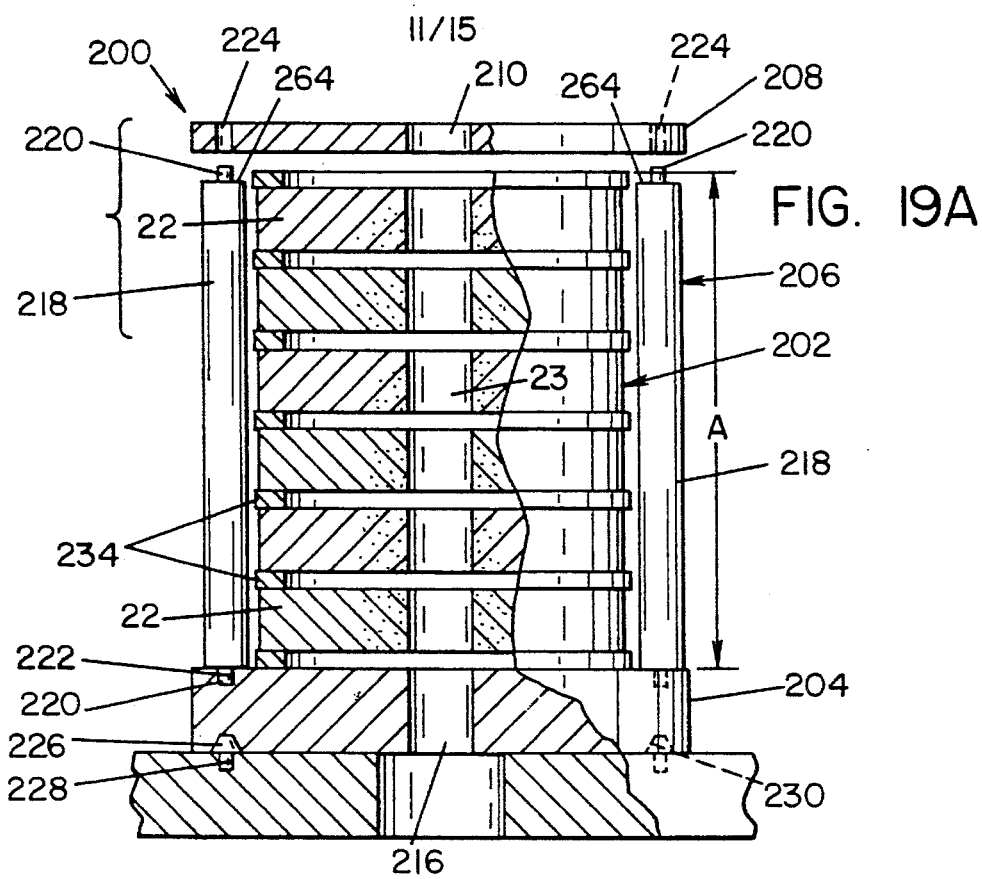
FIG. 19A presents a process for assembling a fixture according to an aspect of the invention.
Figure 19B:
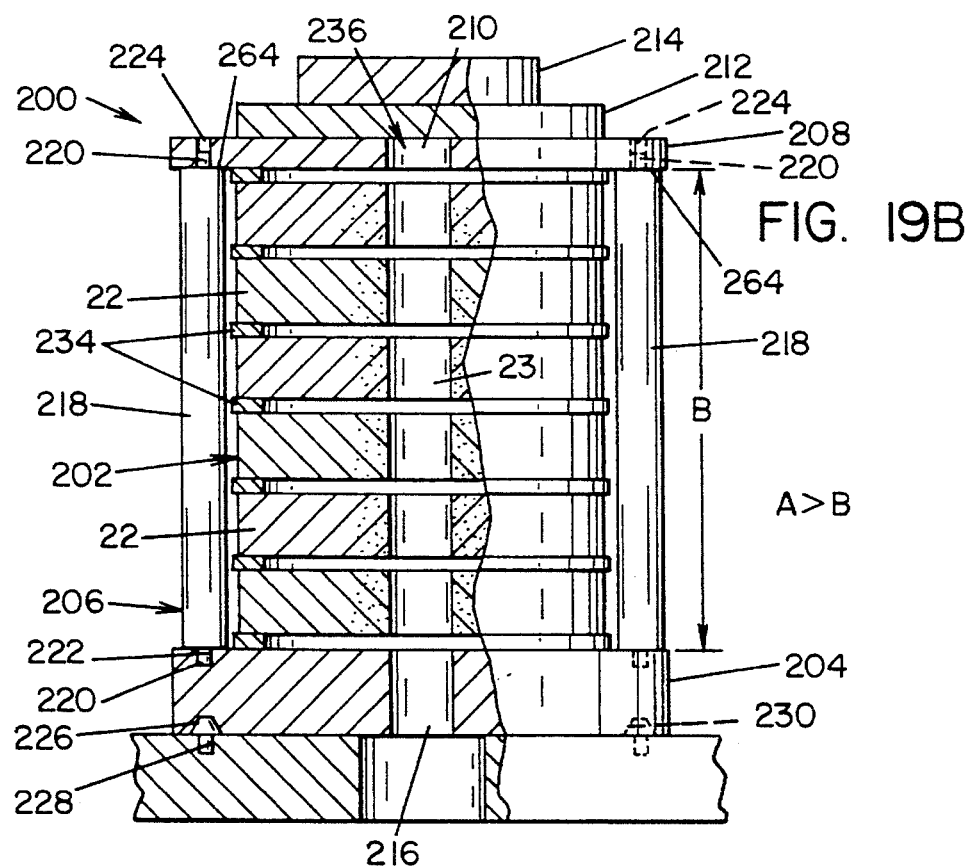
FIG. 19B presents a process for assembling a fixture according to an aspect of the invention.

Referring now to FIGS. 19A and 19B, a preferred process for assembling fixture 200 is presented. According to a preferred embodiment, the spacing structure 206 separably engages the top plate 208 thereby permitting the top plate 208 to move away from the spacing structure 206. This is accomplished in fixture 200 by the spacing posts 218 having pins 220, and the top plate 208 having top plate holes 224 that receive the pins 220, as previously described. The pins 220 engage top plate holes 224 in a slip fit so the top plate 208 may freely move toward and away from the spacing structure 206. The spacing structure 206 and stack of porous structures 202 are arranged so that the stack defines a height A relative to the top surface of the base plate 204 before the top plate 208 is installed (before the stack 202 is disposed between the opposing plates 204 and 208), the spacing structure defines a height B relative to the top surface of base plate 204, wherein A is greater than B. The top plate 208 is then placed upon the stack of porous structures 202 and forced toward the base plate 204 until it seats on the spacing structure 206, as shown in FIG. 19B, which compresses the stack of porous structures 202 a predetermined amount to height B. The top plate 208 seats upon a stop defined by the post 218. Thus, the process of assembling fixture 200 with the stack of porous structures 202 includes placing the stack of porous structures 22 in compression between the opposing plates 204 and 208 by forcing the opposing plates 204 and 208 a distance (A minus B) toward each other that reduces the stack height A by compression. The compression of the stack 202 causes the cavity 236 to become sealed by virtue of the previously described sealing arrangements described in relation to FIGS. 12A–15B. Still referring to FIGS. 19A and 19B, the base plate 204, the spacing structure 206, and the top plate 208 are preferably oriented such that gravity forces the top plate 208 toward the base plate 204 and prevents the top plate 208 from moving away from the spacing structure 206. A weight 214 may be placed upon the top plate 208, with or without top plate aperture 210, if the top plate lacks sufficient mass to compress the stack 202 to height B. The cover plate 212 may be used if top plate 208 has a top plate aperture 210, as previously described. The weight 214 and/or the cover plate 212 rest upon the top plate 208 and are retained by the force of gravity. The weight 214 may be formed from a graphite block, a refractory metal or other material having suitable high temperature resistant properties. The cover plate 212 may be dish-shaped in order to contain the weight 214.

The distance (A minus B) the stack 202 is compressed is preferably predetermined, and the process of assembling the fixture 200 includes the step of adjusting the difference between A and B in order to achieve the desired compression. The height B may be adjusted by adjusting the stop 264 using shims 266 as presented in FIG. 18. The shims 266 are preferably annular in shape if the spacing structure 206 utilizes cylindrical posts 218. The shims may be placed over pins 220 at one or both ends of the post 218. Shims of different thickness and multiple stacked shims may be used to accurately adjust the height B. The height A may be adjusted by disposing more than one ring-like spacer 234 between a pair of neighboring porous structures 22 as presented in FIG. 16. A compliant ring-like gasket 268 may be disposed between adjacent ring-like spacers 234 in order to provide an adequate seal. A ring-like spacer 270 and ring-like spacer 234 having different thicknesses, as presented in FIG. 17, may also be used to adjust the height A. Both the height A and the height B may be adjusted to accurately provide a predetermined amount of compression. According to a preferred embodiment, the spacing structure 206 is designed to be used with a stack having a known stack height A. Adjusting the distance (A–B) is then limited to adjusting the stop 264 with shims. This approach greatly simplifies the process of assembling fixture 200 with the stack 202. According to a certain embodiment the distance (A–B) is about ¼ inch for a B dimension of about 16 inches.

Figure 20:
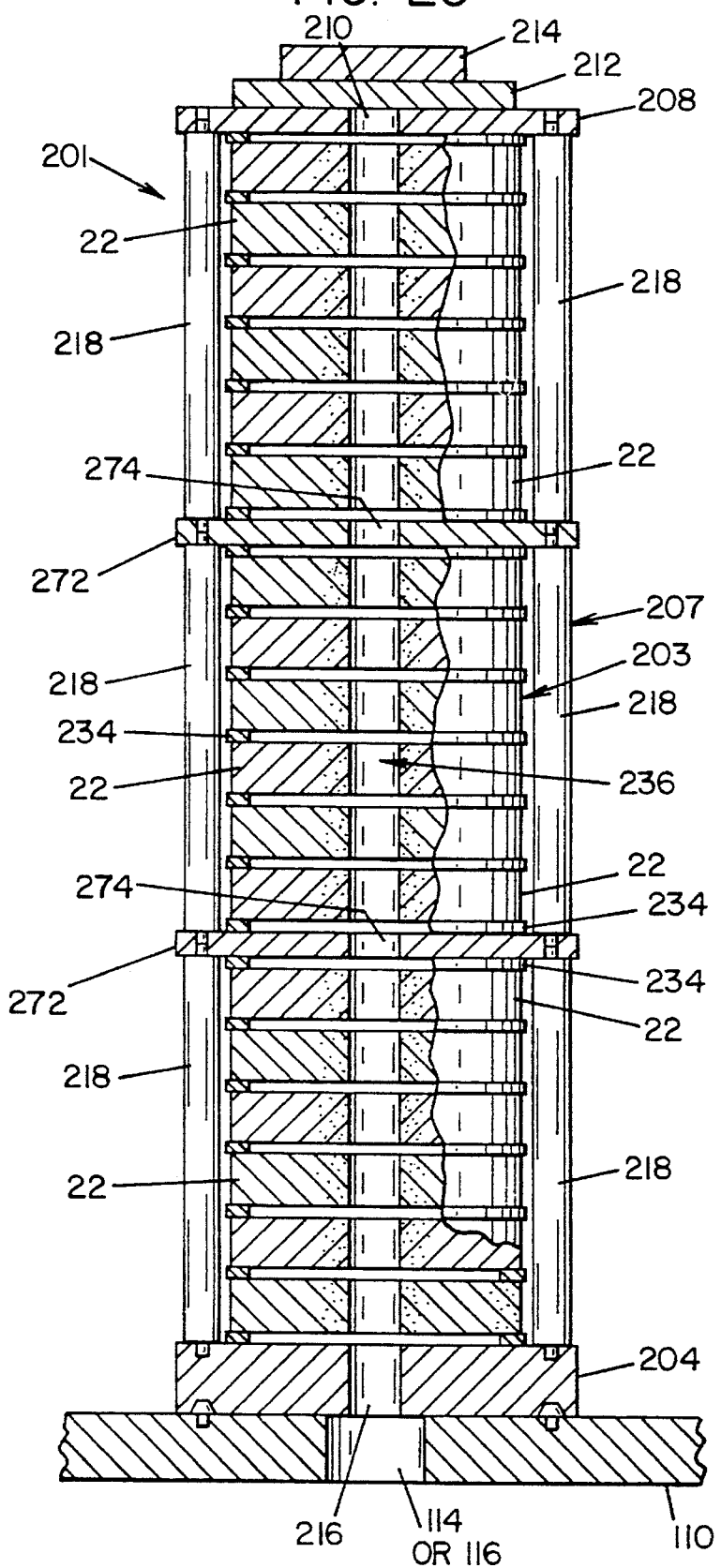
FIG. 20 presents an alternative fixture with porous structures according to an aspect of the invention.

Referring to FIG. 20, a preferred fixture 201 is presented for pressure gradient CVI/CVD densifying a large number of porous structures 22. The spacing structure 207 comprises at least one intermediate plate 272 disposed between the base plate 204 and the top plate 208 that divides the stack of porous structures 203. In other respects, fixture 201 is essentially identical to fixture 200. Each intermediate plate 272 has an intermediate plate aperture 274 therethrough is sandwiched between a pair of the porous structures 22. The enclosed cavity 236 further includes each intermediate plate aperture 274. At least one of the ring-like spacers 234 may be disposed on either side of the intermediate plate 272 between the intermediate plate 272 and the porous structures 22 and may utilize the sealing arrangements of FIGS. 12A through 13B. Multiple fixtures 201 may be stacked. In such case, the base plate 204 from one fixture 201 engages the top plate 208 of a lower fixture 201 with the upper fixture base plate aperture 216 in fluid communication with the lower fixture top plate aperture 210. Thus, the enclosed cavity extends from one fixture 201 to the next until being terminated by the cover plate 212 disposed over the uppermost top plate aperture 210.

Figure 21:
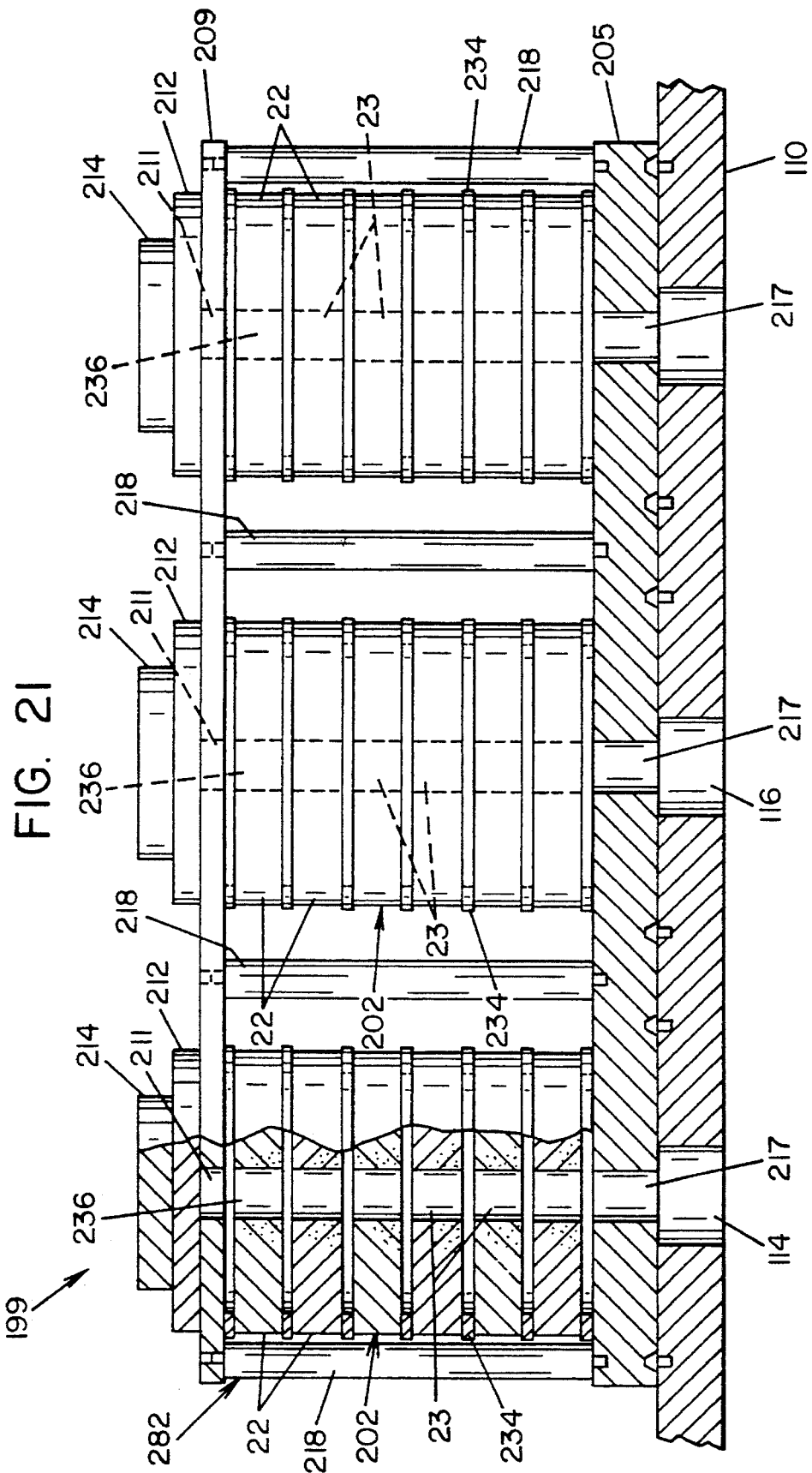
FIG. 21 presents an alternative fixture with porous structures according to an aspect of the invention.

FIG. 21 presents a fixture 199 whereby first and second or more stacks of porous structures may be disposed adjacent each other. A plurality of adjacent stacks of porous structures 202 are disposed between a top plate 209 and a base plate 205 along with a spacing structure 282. A spacing structure 282 comprises a multitude of posts 218. A top plate 209 optionally has a top plate aperture 211 for each stack 202 that may be sealed by cover plates 212 and weights 214. A base plate has a base plate aperture 217 for each stack 202 and the cover plate 110 has a cover plate aperture for each stack 202. In other respects, fixture 199 is very similar to fixture 200 and is preferably assembled in the same manner as described in relation to FIGS. 19A and 19B. In addition, spacing structure 282 may comprise intermediate plates that divide the stacks 202, and multiple fixtures 199 may be stacked one on top of another as described in relation to fixture 201 of FIG. 20. Thus, the features of fixtures 199 and 201 may thus be combined as necessary to enable pressure gradient densification of a very large number of porous structures 22.

Figure 22:
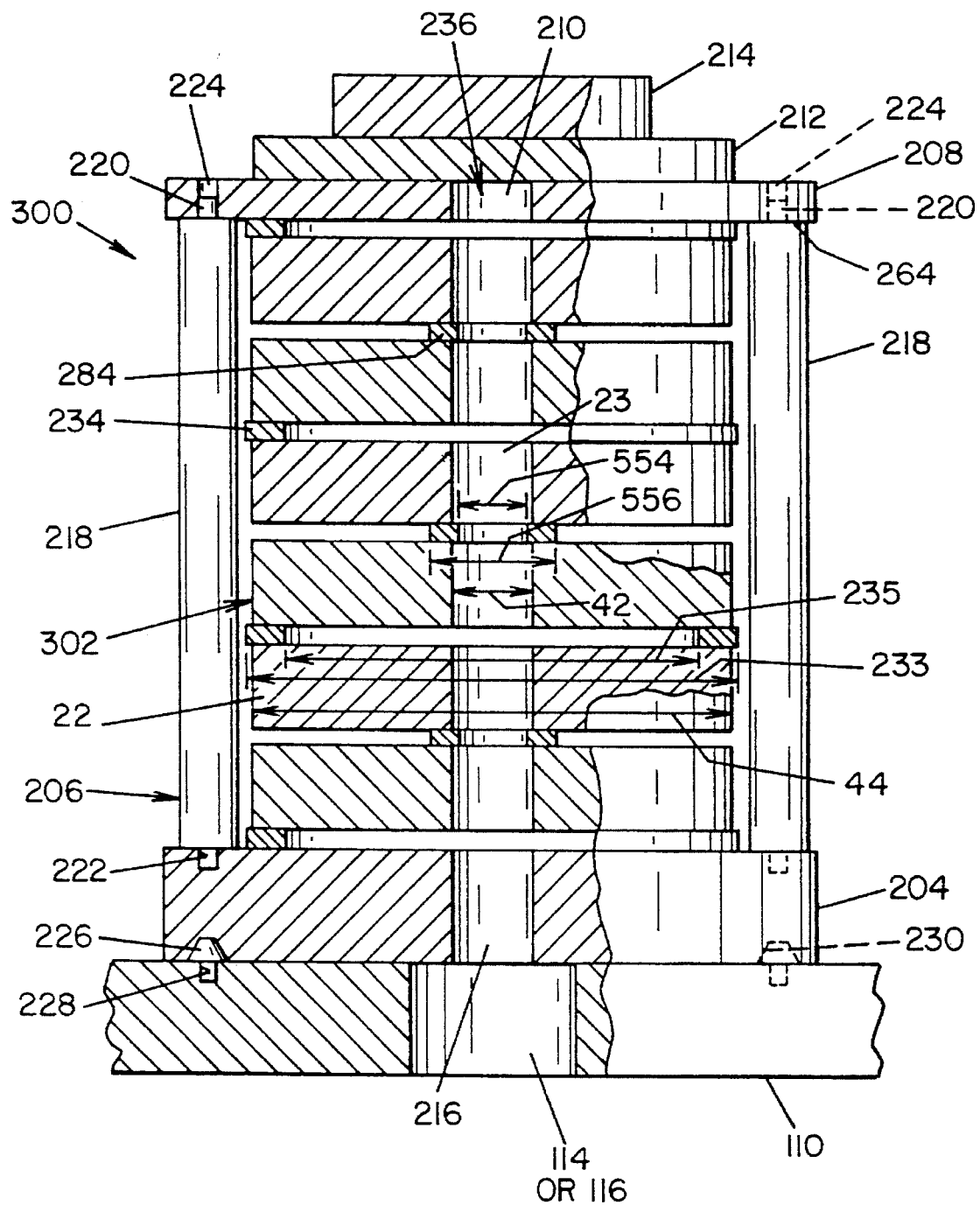
FIG. 22 presents an alternative fixture with porous structures according to an aspect of the invention having alternating "ID" and "OD" seals.

Referring to FIG. 22, an alternative fixture 300 for pressure gradient densifying a stack of porous structures 302 is presented. Fixture 300 is essentially identical to fixture 200, except stack 302 comprises "OD" (outside diameter) ring-like spacers 234 disposed around the outside diameter of each porous structure 22 alternated with "ID" (inside diameter) ring-like spacers 284 disposed around the inside diameter of each porous structure. The OD ring-like spacers 234 preferably have an inside diameter 233 slightly less than the porous structure outside diameter 44, and an outside diameter 235 that is generally coterminous with the porous structure outside diameter 44. The ID ring-like spacers 284 preferably have an outside diameter 554 slightly greater than the porous structure inside diameter 42, and an inside diameter 546 that is generally coterminous with the porous structure inside diameter 42. With ID ring-like spacers 284, the porous structure outside diameter 44 is greater than said outside diameter 556 of the ring like spacer 284. The wall thickness of each ring-like spacer 234 and 284 is preferably minimized in order to maximize exposure of the porous structure surface area to the reactant gas as it enters or leaves each porous structure 22. The alternating ID/OD arrangement of FIG. 22 may also be used with fixtures 199 and 201.

Figure 23:
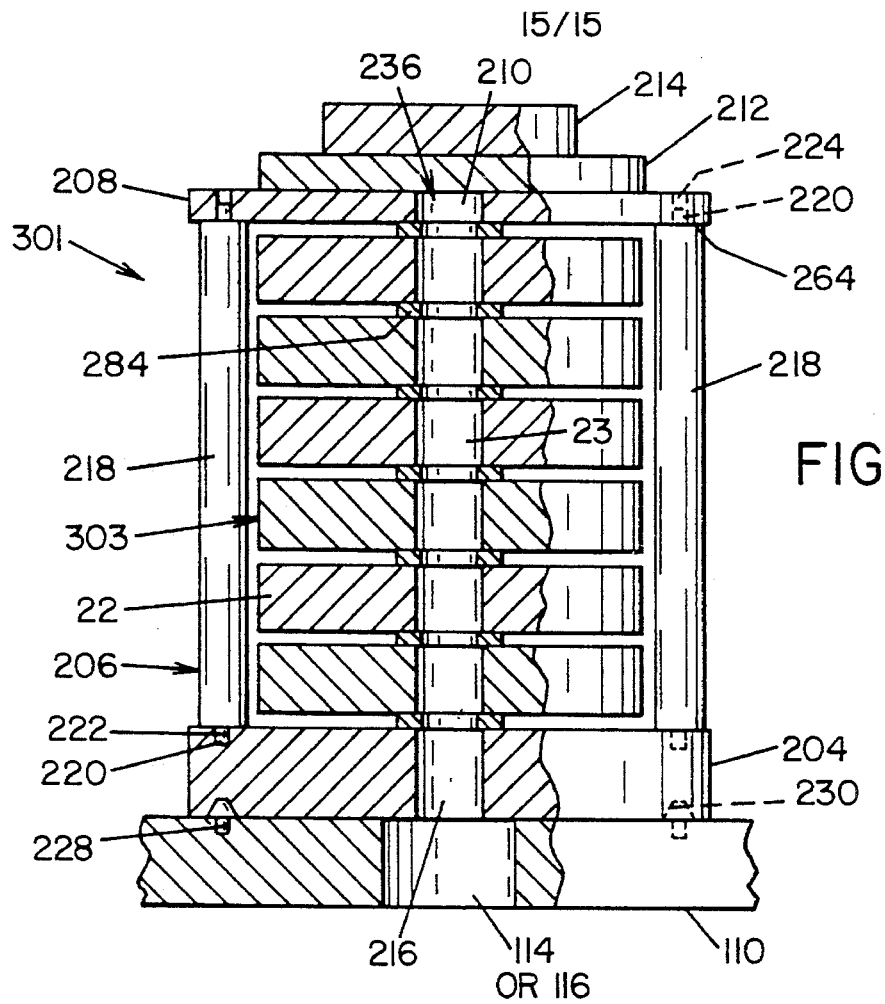
FIG. 23 presents an alternative fixture with porous structures according to an aspect of the invention having all "ID" seals.
Figure 24:
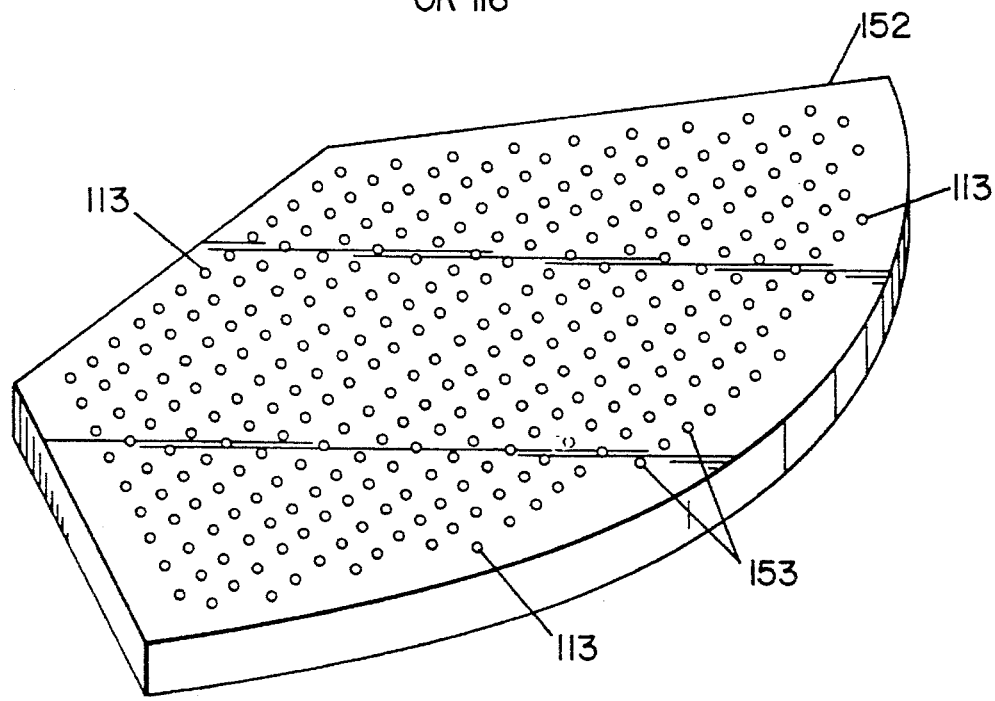
FIG. 24 presents a cover plate having an array of perforations for use with a preheater according to an aspect of the invention.

Referring to FIG. 23, an alternative fixture 301 for pressure gradient densifying a stack of porous structures 303 is presented. Fixture 301 is essentially identical to fixture 200, except stack 303 comprises all "ID" ring-like spacers 284 disposed around the inside diameter of each porous structure. The all ID arrangement of FIG. 23 may also be used with fixtures 199 and 201. The various joints within fixtures 300 and 301 may be sealed as previously described in relation to FIGS. 12A through 15B. The stack height and spacing structure may be adjusted as described in relation to FIGS. 16 through 19B.

It is evident that many variations are possible without departing from the scope of the invention as defined by the claims that follow.

What is claimed is:

1. A fixture with porous structures to be pressure gradient CVI/CVD densified inside a furnace, comprising:

a stack of porous structures, each porous structure having an aperture therethrough;

a base plate adapted to be secured inside the furnace, said base plate having a base plate aperture therethrough;

a top plate spaced from and facing said base plate;

a spacing structure disposed between said base plate and said top plate, said spacing structure engaging said base plate and said top plate, said stack of porous structures being disposed between said base plate and said top plate with one of said porous structures adjacent said base plate and another of said porous structures adjacent said top plate; and, at least one ring-like spacer disposed within said stack of porous structures between each pair of neighboring porous structures, said ring-like spacer encircling the neighboring porous structure apertures;

wherein said base plate, said stack of porous structures, and said at least one ring-like spacer define an enclosed cavity extending from said base plate aperture, including each porous structure aperture, and terminating proximate said top plate.

2. The fixture of claim 1, wherein at least one of said ring-like spacers is disposed around said base plate aperture between said base plate and said porous structure adjacent said base plate.

3. The fixture of claim 1, wherein at least one of said spacers is disposed between said top plate and the porous structure adjacent said top plate.

4. The fixture of claim 1, wherein said top plate has a top plate aperture therethrough, and further comprising a cover plate covering said top plate aperture, and a cover plate seal disposed between said cover plate and said top plate encircling said top plate aperture, said cover plate and said cover plate seal terminating said enclosed cavity.

5. The fixture of claim 1, wherein said porous structures are compliant, and wherein each ring-like spacer comprises two generally parallel ring sides spaced from each other and facing said neighboring porous structures, said neighboring porous structures being pressed against said ring-link spacer.

6. The fixture of claim 1, wherein each ring-like spacer comprises two generally parallel ring sides spaced from each other and facing said neighboring porous structures and further comprising a plurality of compliant graphite gaskets, at least one gasket being disposed adjacent each ring side, each gasket being pressed against said neighboring porous structure.

7. The fixture of claim 1, wherein said porous structures are compliant, and said stack of porous structures is disposed in compression between said base plate and said top plate.

8. The fixture of claim 1, wherein said spacing structure comprises a plurality of posts disposed about the stack of porous structures extending between said base plate and said top plate.

9. The fixture of claim 1, wherein said spacing structure separably engages said top plate thereby permitting said top plate to move away from said spacing structure, and wherein said base plate, said spacing structure, and said top plate are oriented such that gravity forces said top plate toward said base plate thereby preventing said top plate from moving away from said spacing structure.

10. The fixture of claim 1 further comprising a weight that rests upon said top plate.

11. The fixture of claim 1, further comprising at least a second stack of porous structures, each second porous structure having a second porous structure aperture therethrough, and wherein said base plate has at least a second base plate aperture therethrough, said second stack of porous structures being disposed between said base plate and said top plate with one of said second porous structures adjacent said base plate and another of said second porous structures adjacent said top plate, and at least one second ring-like spacer disposed within said second stack of porous structures between each pair of neighboring second porous structures, said ring-like spacer encircling said neighboring second porous structure apertures;

wherein said base plate, said second stack of porous structures, and said at least one second ring-like spacer define a second enclosed cavity extending from said base plate aperture, including each second porous structure aperture, and terminating proximate said top plate.

12. The fixture of claim 1, wherein said spacing structure comprises at least one intermediate plate disposed between said base plate and said top plate that divides the stack of porous structures, each intermediate plate being sandwiched between a pair of the porous structures, each intermediate plate having an aperture therethrough, and wherein each intermediate plate aperture forms a part of said enclosed cavity.

13. The fixture of claim 12, further comprising at least one of said ring-like spacers disposed on either side of said intermediate plate between said intermediate plate and said porous structures.

14. The fixture of claim 1, wherein each porous structure defines a porous structure outside diameter and each ring-like spacer defines a spacer outside diameter, said porous structure outside diameter of at least one porous structure being greater than said spacer outside diameter of at least one ring-like spacer.

15. The fixture of claim 1, wherein each porous structure aperture defines a porous structure inside diameter and each ring-like spacer aperture defines a spacer inside diameter, said porous structure inside diameter being less than said spacer inside diameter of at least one ring-like spacer.

16. The fixture of claim 1, wherein each porous structure defines a porous structure inside diameter and each ring-like spacer defines a spacer inside diameter, each porous structure inside diameter being less than said spacer inside diameter.

17. The fixture of claim 2, wherein each porous structure defines a porous structure outside diameter, and said spacer inside diameter is slightly less than said porous structure outside diameter.

18. The fixture of claim 1, wherein each porous structure is annular and defines a porous structure outside diameter and a porous structure inside diameter, and wherein said stack of porous structures comprises inside diameter ring-like spacers alternated with outside diameter ring-like spacers, each outside diameter ring-like spacer having an inside diameter slightly less than the porous structure outside diameter, and an outside diameter that is generally coterminous with the porous structure outside diameter, each inside diameter ring-like spacer having an outside diameter slightly greater than the porous structure inside diameter, and an inside diameter that is generally coterminous with the porous structure inside diameter.

19. The fixture of claim 1, wherein each porous structure is annular and defines a porous structure inside diameter, and wherein said stack of porous structures comprises all inside diameter ring-like spacers, each inside diameter ring-like spacer having an outside diameter slightly greater than the porous structure inside diameter, and an inside diameter that is generally coterminous with the porous structure inside diameter.

20. A process for assembling a fixture and multitude of porous structures to be CVI/CVD densified, each porous structure having an aperture therethrough, comprising the steps of:

assembling said multitude of porous structures and ring-like spacers in a stack with a ring-like spacer between each adjacent pair of porous structures;

disposing said stack of porous structures between a base plate and a top plate, said base plate having a base plate aperture therethrough, wherein said base plate, said stack of porous structures, and said at least one ring-like spacer define an enclosed cavity extending from said base plate aperture, including each porous structure aperture, and terminating proximate said top plate;

disposing a spacing structure around said stack of porous structures between said base plate and said top plate, said spacing structure engaging said base plate and said top plate.

21. The process of claim 20, wherein each porous structure defines an outside diameter, and each ring-like spacer comprises a ring generally coterminous with said outside diameter.

22. The process of claim 20, wherein said stack of porous structures is compliant and said porous structures define a stack height before the stack of porous structures is disposed between said opposing plates, and further comprising the step of placing said stack of porous structures in compression between said opposing plates by forcing said opposing plates a distance toward each other that reduces said stack height by compression.

23. The process of claim 22, wherein said spacing structure defines a stop that limits said distance.

24. The process of claim 23, wherein said distance is predetermined, and further comprising the step of adjusting said stop to achieve said distance.

25. The process of claim 24, further comprising the step of adjusting said stop with shims.

26. The process of claim 20, wherein each porous structure is annular and defines a porous structure outside diameter, and wherein said stack of porous structures comprises all outside diameter ring-like spacers, each outside diameter ring-like spacer having an inside diameter slightly less than the porous structure outside diameter, and an outside diameter that is generally coterminous with the porous structure outside diameter.

27. The process of claim 20, wherein each porous structure is annular and defines a porous structure outside diameter and a porous structure inside diameter, and wherein said stack of porous structures comprises inside diameter ring-like spacers alternated with outside diameter ring-like spacers, each outside diameter ring-like spacer having an inside diameter slightly less than the porous structure outside diameter, and an outside diameter that is generally coterminous with the porous structure outside diameter, each inside diameter ring-like spacer having an outside diameter slightly greater than the porous structure inside diameter, and an inside diameter that is generally coterminous with the porous structure inside diameter.

28. The process of claim 20, wherein each porous structure is annular and defines a porous structure inside diameter, and wherein said stack of porous structures comprises all inside diameter ring-like spacers, each inside diameter ring-like spacer having an outside diameter slightly greater than the porous structure inside diameter, and an inside diameter that is generally coterminous with the porous structure inside diameter.

* * * * *